(12) United States Patent
Futakuchi et al.

(10) Patent No.: US 10,996,246 B2
(45) Date of Patent: May 4, 2021

(54) CURRENT DETECTION METHOD, CURRENT DETECTION DEVICE, SIGNAL CORRECTION METHOD FOR CURRENT DETECTION DEVICE, AND SIGNAL CORRECTION DEVICE FOR CURRENT DETECTION DEVICE

(71) Applicant: Hitachi Metals, Ltd., Tokyo (JP)

(72) Inventors: Naoki Futakuchi, Hitachinaka (JP); Naofumi Chiwata, Mito (JP); Katsuya Akimoto, Mito (JP)

(73) Assignee: HITACHI METALS, LTD., Tokyo (JP)

( * ) Notice: Subject to any disclaimer, the term of this patent is extended or adjusted under 35 U.S.C. 154(b) by 1037 days.

(21) Appl. No.: 15/517,614

(22) PCT Filed: Oct. 10, 2014

(86) PCT No.: PCT/JP2014/077246
§ 371 (c)(1),
(2) Date: Apr. 7, 2017

(87) PCT Pub. No.: WO2016/056136
PCT Pub. Date: Apr. 14, 2016

(65) Prior Publication Data
US 2017/0307663 A1    Oct. 26, 2017

(51) Int. Cl.
*G01R 15/20* (2006.01)
*G01R 33/09* (2006.01)

(52) U.S. Cl.
CPC ............. *G01R 15/20* (2013.01); *G01R 33/09* (2013.01); *G01R 33/093* (2013.01)

(58) Field of Classification Search
CPC ........ G01D 5/145; G01R 33/07; G01R 33/04; G01R 15/20; G01R 33/09; G01R 33/093
See application file for complete search history.

(56) References Cited

U.S. PATENT DOCUMENTS

| 4,099,238 A * | 7/1978 | Suzuki | G01R 33/07 324/251 |
| 2005/0258825 A1* | 11/2005 | Masuda | G01D 5/145 324/207.26 |
| 2008/0036456 A1* | 2/2008 | Kishida | G01R 33/04 324/244 |

FOREIGN PATENT DOCUMENTS

| JP | 2000-055997 A | 2/2000 |
| JP | 2001-343439 A | 12/2001 |
| JP | 2008-203238 A | 9/2008 |

OTHER PUBLICATIONS

IPRP in related international Application No. PCT/JP2014/077246 dated Apr. 20, 2017.

(Continued)

*Primary Examiner* — Andrew Schechter
*Assistant Examiner* — Kaleria Knox
(74) *Attorney, Agent, or Firm* — Roberts Calderon Safran & Cole P.C.

(57) ABSTRACT

A current detection method for a current detection device including magnetism detection elements that detect magnetic flux density and output a voltage signal corresponding to the magnetic flux density is provided. The method includes acquiring measured value data that is obtained as a result of providing magnetic flux density in a detectable range of the magnetism detection elements that indicates the relationship between the magnetic flux density and an output voltage signal from the current detection device. Next, computational processing is performed so as to fit the acquired measured value data to a formula that includes plural factors and indicates the output voltage of the magnetism detection elements, thereby calculating the plural factors, and correcting the output voltage signal from the magnetism detection elements in accordance with the calculated factors so as to be approximately linear with respect (Continued)

to the magnetic flux density. Finally, a corrected voltage signal obtained by the correction is outputted.

15 Claims, 9 Drawing Sheets

(56) References Cited

OTHER PUBLICATIONS

Office Action issued in the corresponding Japanese Patent Application No. 2016-552792 dated May 8, 2018.
International Search Report and Written Opinion issued in the corresponding application PCT/JP2014/077246 dated Jan. 6, 2015.

* cited by examiner

FIG.7
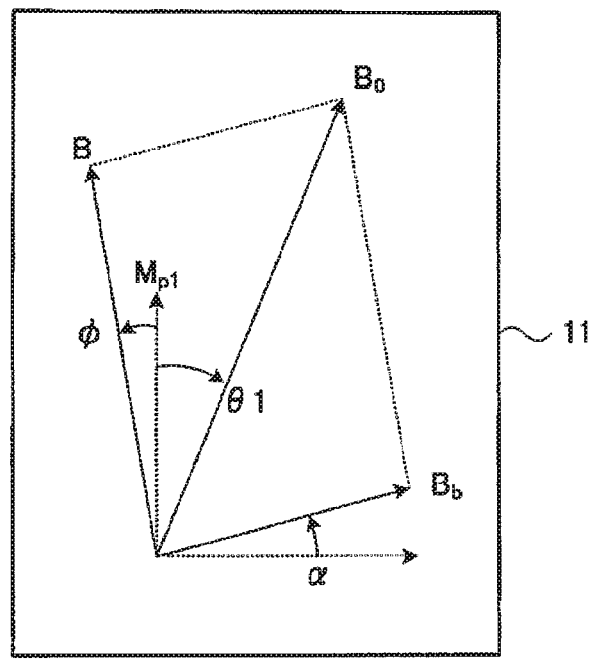
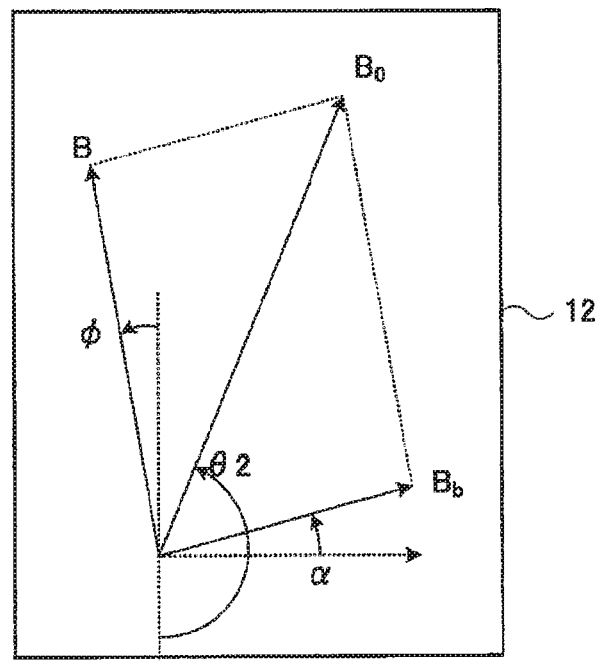

CURRENT DETECTION METHOD, CURRENT DETECTION DEVICE, SIGNAL CORRECTION METHOD FOR CURRENT DETECTION DEVICE, AND SIGNAL CORRECTION DEVICE FOR CURRENT DETECTION DEVICE

CROSS-REFERENCE TO RELATED APPLICATIONS

The present application is a U.S. National Phase of PCT/JP2014/077246 filed on Oct. 10, 2014. The disclosure of the PCT Application is hereby incorporated by reference into the present application.

TECHNICAL FIELD

The present invention relates to a current detection method and a current detection device for detecting a current value by measuring a magnetic field generated by an electric current flowing through a conductor, a signal correction method for the current detection device, and a signal correction device for the current detection device.

BACKGROUND ART

Conventional current detection devices are known, in which a magnetoresistance effect element(s) such as AMR element using the anisotropic magnetoresistive (AMR) effect or GMR element using the giant magnetoresistive (GMR) effect is/are used (see, e.g., PTL 1).

The current detection device described in PTL 1 uses a method in which a magnetic field in a region with a relatively linearly varying resistance is selected as a bias magnetic field, the bias magnetic field is applied to a magnetoresistance effect element, and a magnetic field in the region centered around the bias magnetic field is measured. However, since the region with a linearly varying resistance is narrow, there is a problem that the range of the measurable magnetic field is very narrow. Then, to solve this problem, a bias magnetic field applying means is provided to apply a bias magnetic field with plural values to the magnetoresistance effect element. This allows the simple structure to improve linearity of the magnetic field with respect to the output and thus the measurement range to be extended.

CITATION LIST

Patent Literature

[PTL 1]
JP-A-2000-055997

SUMMARY OF INVENTION

Technical Problem

However, the current detection device described in PTL 1 only improves the simulated linearity between the magnetic field and the output, i.e., between the magnetic flux density to be detected and the output voltage by changing the bias magnetic field, and the relationship between the magnetic flux density and the output voltage of the magnetoresistance effect element is still non-linear, hence, capable of using only the range with a linear relationship between the magnetic flux density and the output voltage (the range in which the relationship between the magnetic flux density and the output voltage can be regarded as linear). Therefore, the range of magnetic flux density effectively detected by the magnetoresistance effect element is narrow and it may causes the magnetoresistance effect element to be arranged relatively less freely.

Thus, it is an object of the invention to provide a current detection method capable of making the relationship of output voltage to magnetic flux density an approximately linear relationship that has high linearity, a current detection device, a signal correction method for the current detection device, and a signal correction device for the current detection device.

Solution to Problem

To solve the above-mentioned problems, the invention provides a current detection method for a current detection device comprising magnetism detection elements that detect magnetic flux density and output a voltage signal corresponding to the magnetic flux density, the method comprising: acquiring measured value data that is obtained as a result of providing magnetic flux density in a detectable range of the magnetism detection elements and indicates the relationship between the magnetic flux density and an output voltage signal from the current detection device; performing computational processing so as to fit the acquired measured value data to a formula that includes a plurality of factors and indicates the output voltage of the magnetism detection elements, thereby calculating the plurality of factors for a measured magnetic field B and indicates an output voltage signal $V_f$ of the magnetism detection elements, thereby calculating the plurality of factors; and correcting the output voltage signal from the magnetism detection elements in accordance with the calculated plurality of factors so as to be approximately linear with respect to the magnetic flux density, and then outputting a corrected voltage signal obtained by the correction, wherein the formula is expressed by:

$$V_f = A1 + \frac{A4 \times B + A5}{\sqrt{B^2 + A2 \times B + A3}}$$

and each of the factors A1 to A5 is calculated so that the output voltage signal $V_f$ obtained by the formula is fitted to an output voltage signal of the measured value data.

To solve the above-mentioned problems, the invention also provides a current detection device, comprising: magnetism detection elements that detect magnetic flux density and output a voltage signal corresponding to the magnetic flux density; and a signal correction means that corrects the output voltage signal from the magnetism detection elements so as to be approximately linear with respect to the magnetic flux density and then outputs a corrected voltage signal obtained by the correction, the correction being performed in accordance with a plurality of factors calculated by computational processing that is performed so that measured value data obtained as a result of providing the magnetic flux density to the magnetism detection elements and indicating the relationship between the magnetic flux density and an output voltage signal is fitted to a formula including the plurality of factors for a measured magnetic field B and indicates an output voltage signal $V_f$ of the magnetism detection elements, wherein the formula is expressed by:

$$V_f = A1 + \frac{A4 \times B + A5}{\sqrt{B^2 + A2 \times B + A3}}$$

and each of the factors A1 to A5 is calculated so that the output voltage signal $V_f$ obtained by the formula is fitted to an output voltage signal of the measured value data.

Furthermore, to solve the above-mentioned problems, the invention provides a signal correction method for a current detection device comprising magnetism detection elements that detect magnetic flux density and output a voltage signal corresponding to the magnetic flux density and a signal correction means that comprises a storage unit for storing a plurality of factors and is configured to directly output an output voltage signal from the magnetism detection elements without change when the plurality of factors are not stored in the storage unit, and to correct an output voltage signal from the magnetism detection elements and then output a corrected output voltage signal obtained by the correction when the plurality of factors are stored in the storage unit, the output voltage signal being corrected in accordance with the plurality of factors so as to be approximately linear with respect to the magnetic flux density, the method for the current detection device not storing the plurality of factors in the storage unit of the signal correction means, and the method comprising: acquiring measured value data that is obtained as a result of providing magnetic flux density in a detectable range of the magnetism detection elements and indicates the relationship between the magnetic flux density and an output voltage signal from the current detection device; performing computational processing so as to fit the acquired measured value data to a formula that includes the plurality of factors for a measured magnetic field B and indicates the an output voltage signal $V_f$ of the magnetism detection elements, wherein the formula is expressed by:

$$V_f = A1 + \frac{A4 \times B + A5}{\sqrt{B^2 + A2 \times B + A3}}$$

and each of the factors A1 to A5 is calculated so that the output voltage signal $V_f$ obtained by the formula is fitted to an output voltage signal of the measured value data, thereby calculating the plurality of factors; and storing the calculated plurality of factors in the storage unit of the signal correction means.

Still further, to solve the above-mentioned problems, the invention provides a signal correction method for a current detection device comprising magnetism detection elements that detect magnetic flux density and output a voltage signal corresponding to the magnetic flux density, the method comprising: acquiring measured value data that is obtained as a result of providing magnetic flux density in a detectable range of the magnetism detection elements and indicates the relationship between the magnetic flux density and an output voltage signal from the current detection device; performing computational processing so as to fit the acquired measured value data to a formula that includes a plurality of factors for a measured magnetic field B and indicates an output voltage signal $V_f$ of the magnetism detection elements, wherein the formula is expressed by:

$$V_f = A1 + \frac{A4 \times B + A5}{\sqrt{B^2 + A2 \times B + A3}}$$

and each of the factors A1 to A5 is calculated so that the output voltage signal $V_f$ obtained by the formula is fitted to an output voltage signal of the measured value data, thereby calculating the plurality of factors; storing the calculated plurality of factors in a storage unit of a signal correction means that corrects the output voltage signal from the magnetism detection elements in accordance with the plurality of factors so as to be approximately linear with respect to magnetic flux density and then outputs a corrected voltage signal obtained by the correction; and using the signal correction means with the plurality of factors stored in the storage unit as a signal correction device for the current detection device.

Yet further, to solve the above-mentioned problems, the invention provides a signal correction device for a current detection device comprising magnetism detection elements that detect magnetic flux density and output a voltage signal corresponding to the magnetic flux density, the signal correction device being configured to be connected to the current detection device to correct and output the output voltage signal, wherein the signal correction device corrects the output voltage signal from the magnetism detection elements so as to be approximately linear with respect to magnetic flux density and then outputs a corrected voltage signal obtained by the correction, the correction being performed in accordance with a plurality of factors calculated by computational processing that is performed so that measured value data obtained as a result of providing the magnetic flux density to the magnetism detection elements and indicating the relationship between the magnetic flux density and an output voltage signal $V_f$ is fitted to a formula including the plurality of factors and indicating the output voltage of the magnetism detection elements, wherein the formula is expressed by:

$$V_f = A1 + \frac{A4 \times B + A5}{\sqrt{B^2 + A2 \times B + A3}}$$

and each of the factors A1 to A5 is calculated so that the output voltage signal $V_f$ obtained by the formula is fitted to an output voltage signal of the measured value data.

Advantageous Effects of Invention

According to the invention, it is possible to make the relationship of output voltage to magnetic flux density an approximately linear relationship that has high linearity.

BRIEF DESCRIPTION OF DRAWINGS

FIG. 7 is a diagram illustrating a relationship of bias magnetic field $B_b$, measured electromagnetic field B and measured magnetic field B with respect to the magnetism detection elements in the current detection device.

DESCRIPTION OF EMBODIMENTS

First Embodiment

The first embodiment of the invention will be described below in reference to FIGS. 1A to 8.

Figure 1A:
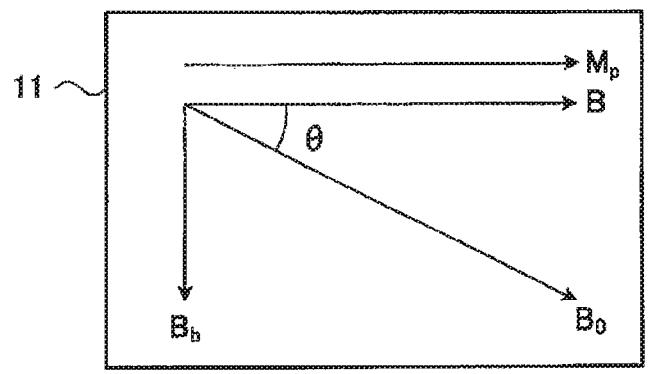
FIG. 1A is a diagram illustrating a magnetic detection principle of magnetism detection elements used in a current detection method, a current detection device and a signal correction method for the current detection device in the first embodiment of the present invention.

FIG. 1A is a diagram illustrating a magnetic detection principle of magnetism detection elements used in a current detection method, a current detection device and a signal correction method for the current detection device in the first embodiment of the invention. A magnetism detection element 11 is constructed from a GMR element. The magnetism detection element 11 is formed by laminating a magnetic pinned layer with a fixed magnetization direction $M_p$, a magnetic free layer with a magnetization direction θ varying depending on a bias magnetic field $B_b$ applied in a direction substantially orthogonal to the magnetization direction $M_p$ as well as depending on a measured electromagnetic field B, and a non-magnetic layer separating the magnetic pinned layer from the magnetic free layer. The measured electromagnetic field B is a magnetic field generated by an electric current to be measured, and θ is an angle of the magnetization direction of the magnetic free layer with reference to the magnetization directions $M_p$ of the magnetic pinned layer.

In the magnetism detection element 11, when the applied direction of the measured electromagnetic field B and the magnetization direction $M_p$ of the magnetic pinned layer are the same direction and substantially parallel to each other and also the magnitude of the measured electromagnetic field B is sufficiently large with respect to the magnitude of the bias magnetic field $B_b$, the angle θ defined between a measured magnetic field B produced by combining the measured electromagnetic field B with the bias magnetic field $B_b$ and the magnetization direction $M_p$ of the magnetic pinned layer becomes small, and accordingly, current density distribution in the lamination direction of the magnetic pinned layer, the non-magnetic layer and the magnetic free layer is expanded and a resistance value R also drops.

Inversely, when the applied direction of the measured electromagnetic field B and the magnetization direction $M_p$ of the magnetic pinned layer are the opposite directions and substantially parallel to each other and also the magnitude of the measured electromagnetic field B is sufficiently large with respect to the magnitude of the bias magnetic field $B_b$, the angle θ defined between the measured magnetic field B and the magnetization direction $M_p$ of the magnetic pinned layer becomes large, and accordingly, current density distribution in the lamination direction of the magnetic pinned layer, the non-magnetic layer and the magnetic free layer is narrowed and the resistance value R also increases. That is, the magnetization direction of the magnetic free layer rotates along with the direction of the synthetic magnetic field $B_0$ produced by combining the measured electromagnetic field B and the bias magnetic field $B_b$, and the resistance value of the magnetism detection element 11 varies according to the rotation of the magnetization direction of the magnetic free layer.

The bias magnetic field $B_b$ has an effect of suppressing hysteresis of the magnetism detection element 11. When sensitivity is decreased by increasing strength of the bias magnetic field $B_b$, a linear range can be expand as a result.

Figure 1B:
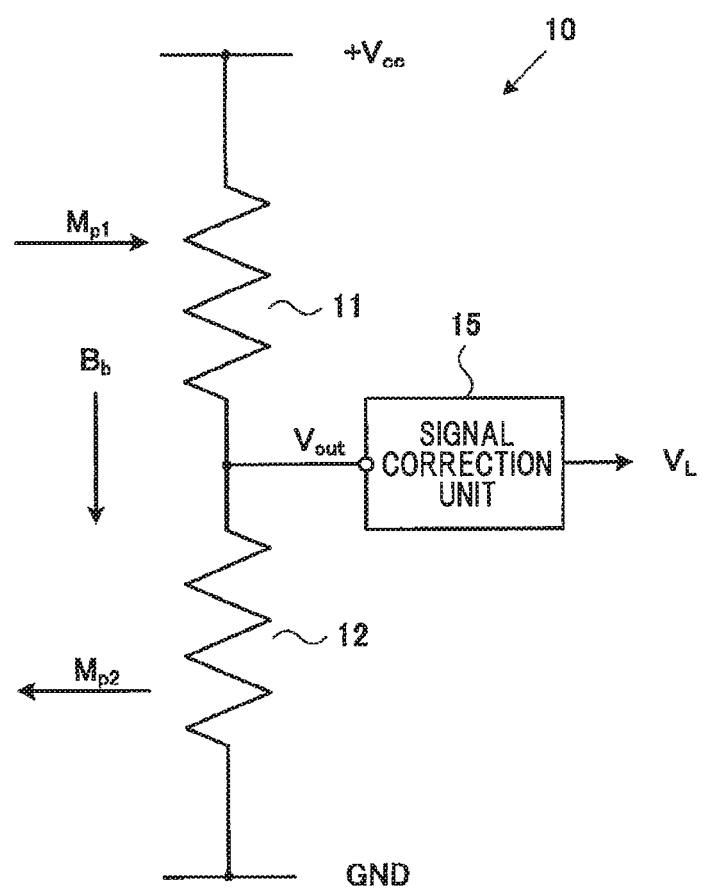
FIG. 1B is a schematic diagram illustrating a configuration of the current detection method and the current detection device in the first embodiment of the invention.

FIG. 1B is a schematic diagram illustrating a configuration of the current detection device in the first embodiment of the invention. In FIG. 1B, a current detection device 10 is a half-bridge configuration in which the magnetism detection element 11 shown in FIG. 1A and a magnetism detection element 12 having the same structure are connected in series so that the magnetization directions $M_{p1}$ and $M_{p2}$ of the respective magnetic pinned layers are opposite to each other. The magnetization direction $M_{p1}$ of the magnetic pinned layer of the magnetism detection element 11 is rightward as indicated by an arrow and the magnetization direction $M_{p2}$ of the magnetic pinned layer of the magnetism detection element 12 is leftward as indicated by another arrow pointing in an exactly opposite direction. Here, the directions pointed by the arrows have nothing to do with the circuit configuration and are used for convenience to show that the magnetization directions of the magnetic pinned layers of the magnetism detection elements 11 and 12 are opposite to each other.

In the current detection device 10, a power-supply voltage +$V_{cc}$ (e.g., about 5.0V) is applied to a first electrode of the magnetism detection element 11 and a second electrode of the magnetism detection element 12 is grounded. An output voltage signal $V_{out}$ is output from a junction between the magnetism detection elements 11 and 12 at which a second electrode of the magnetism detection element 11 is connected to a first electrode of the magnetism detection element 12.

A signal correction unit 15 performs a correction so that the output voltage signal $V_{out}$ output from the junction between the magnetism detection elements 11 and 12 varies approximately linearly, and the signal correction unit 15 then outputs a corrected output voltage signal $V_L$. Here, the bias magnetic fields $B_b$ in the same direction substantially orthogonal to both the magnetization directions $M_{p1}$ and $M_{p2}$ are respectively applied to the magnetism detection elements 11 and 12.

Figure 2:
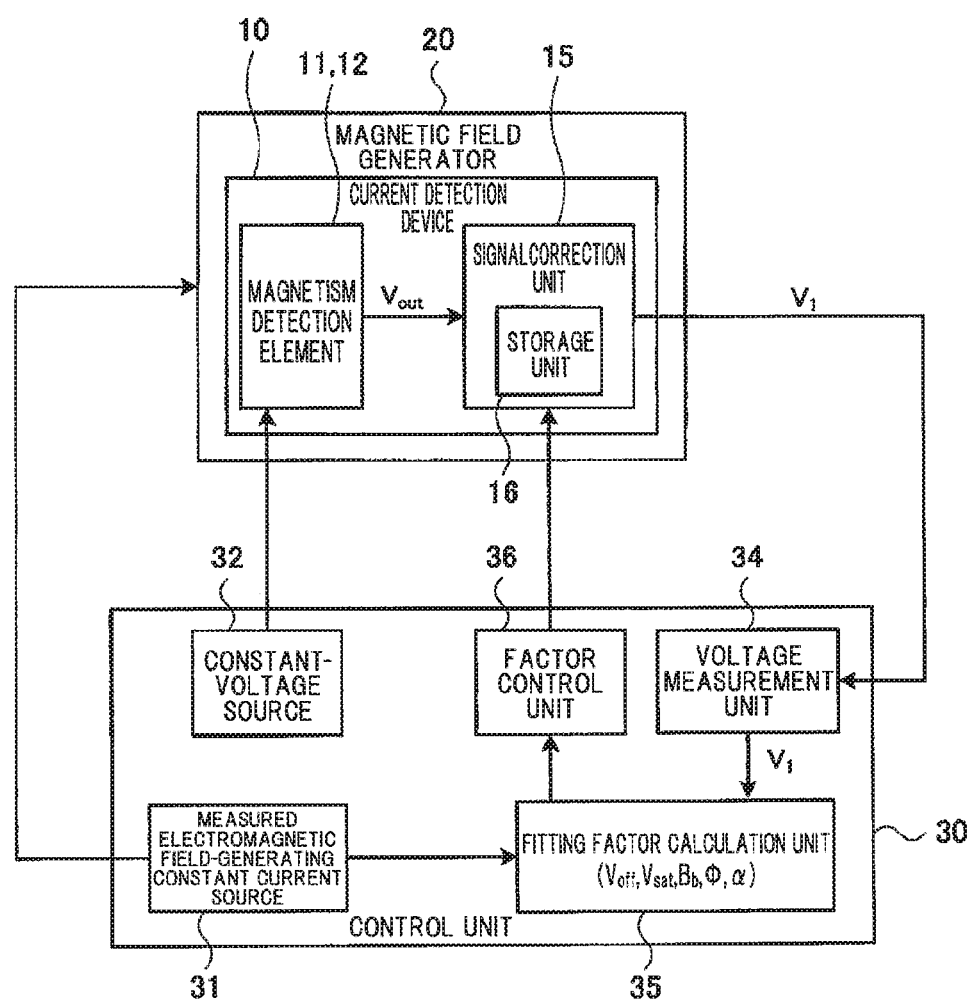
FIG. 2 is a schematic diagram illustrating a configuration of the current detection method, the current detection device and the signal correction method for the current detection device in the first embodiment of the invention.
Figure 3:
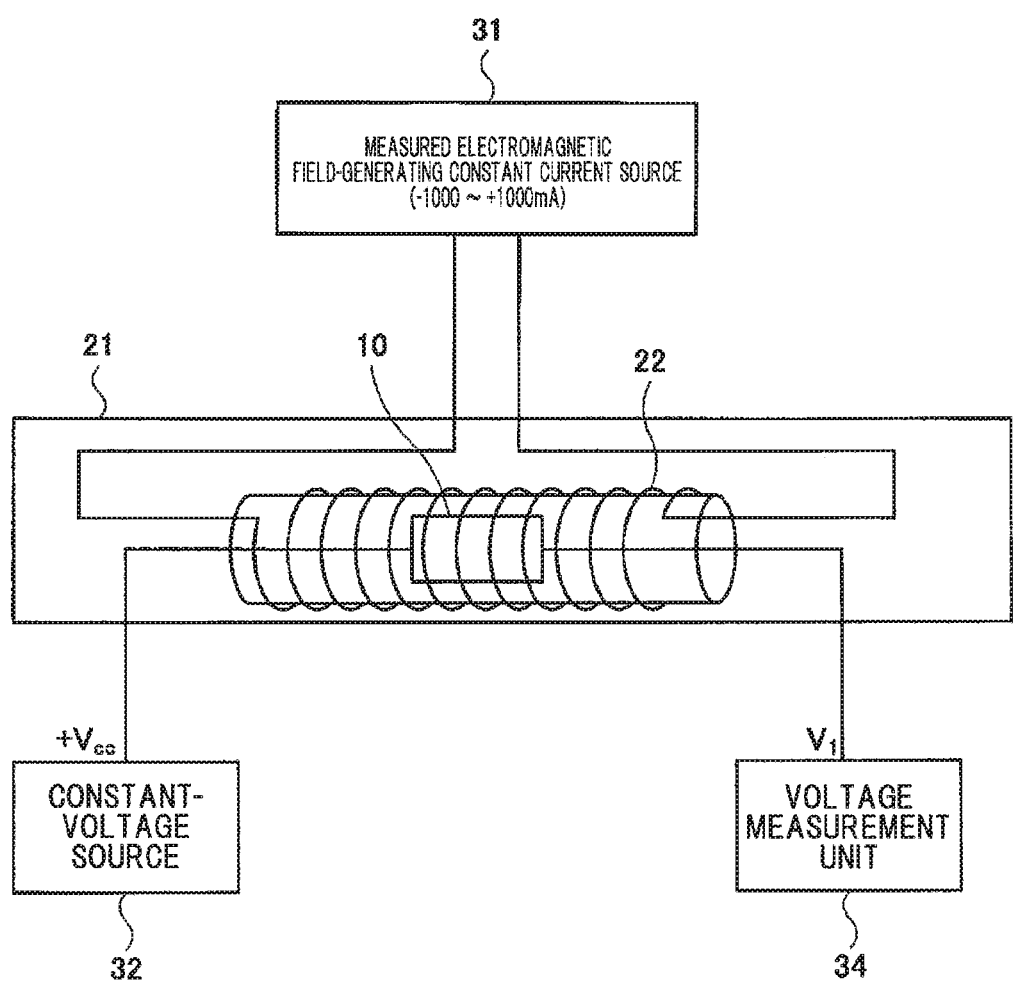
FIG. 3 is a schematic diagram illustrating a configuration of a magnetic field generator for applying a measured electromagnetic field to the current detection device.

FIG. 2 is a schematic diagram illustrating a configuration of the current detection method, the current detection device and the signal correction method for the current detection device in the first embodiment of the invention. FIG. 3 is a schematic diagram illustrating a configuration of a magnetic field generator 20 for applying the measured electromagnetic field B to the current detection device 10.

In the current detection method, the current detection device and the signal correction method for the current detection device in the first embodiment of the invention, the output voltage signal $V_{out}$ output from the current detection device 10 of the half-bridge configuration shown in FIG. 1B is input to the signal correction unit 15 which then outputs a corrected output voltage signal $V_L$ corrected to vary approximately linearly based on predetermined factors.

A control unit 30 is constructed from a control computer of which basic structure is a personal computer (PC) including a monitor. The control unit 30 is provided with a measured electromagnetic field-generating constant current source 31, a constant-voltage source 32, a voltage measurement unit 34, a fitting factor calculation unit 35 and a factor control unit 36.

The magnetic field generator 20 generates the measured electromagnetic field B using a solenoid coil 22 mounted within a magnetic shielding box 21 so that the measured electromagnetic field B is applied to the current detection device 10 placed inside the solenoid coil 22. However, the magnetic field generator 20 may have another configuration as long as the measured electromagnetic field B is applied to the current detection device 10 as an object.

In the current detection device 10, the magnetism detection elements 11, 12 and the signal correction unit 15 are integrated into one chip. The current detection device 10 is conveyed and placed inside the solenoid coil 22 of the magnetic field generator 20 by a handling robot (not shown), etc. In this process, the current detection device 10 is placed so that the magnetization directions $M_{p1}$ and $M_{p2}$ of the magnetic pinned layers thereof are parallel to the direction of the measured electromagnetic field B in the solenoid coil 22.

The measured electromagnetic field-generating constant current source 31 supplies a predetermined electric current, e.g., an electric current between about ±1000 mA, to the solenoid coil 22. The electric current supplied from the measured electromagnetic field-generating constant current source 31 generates the measured electromagnetic field B of, e.g., ±10 mT in the solenoid coil 22.

The electric current supplied from the measured electromagnetic field-generating constant current source 31 to the solenoid coil 22 is controlled by the control unit 30 so that the measured electromagnetic field B generated in the solenoid coil 22 gradually increases from, e.g., −10 mT through 0 mT to +10 mT and gradually decreases from +10 mT through 0 mT to −10 mT.

The constant-voltage source 32 supplies a power-supply voltage $+V_{cc}$ (e.g., about 5.0V) to the current detection device 10 which is placed inside the solenoid coil 22 of the magnetic field generator 20.

The signal correction unit 15 corrects the output voltage signal $V_{out}$ from the current detection device 10 based on various factors (output offset factor $V_{off}$, saturation output factor $V_{sat}$, bias magnetic field strength factor $B_b$, angular offset factor $\varphi$ of a direction of the measured electromagnetic field, angular offset factor $\alpha$ of a direction of the bias magnetic field) stored in a storage unit 16, and then outputs the corrected signal as an output voltage signal $V_1$. A signal correction flag is provided in the storage unit 16. The signal correction flag=0 indicates that the predetermined factors are not stored, and the signal correction flag=1 indicates that the predetermined factors are stored.

When the signal correction flag is set to "0", the signal correction unit 15 directly outputs the output voltage signal $V_{out}$ as the output voltage signal $V_1$. On the other hand, when the signal correction flag is set to "1", the signal correction unit 15 corrects the output voltage signal $V_{out}$ and then outputs the corrected signal as the output voltage signal $V_1$. The details of the factors stored in the storage unit 16 will be described later.

The voltage measurement unit 34 measures the output voltage signal $V_1$ output from the signal correction unit 15 during application of the gradually increasing measured electromagnetic field B as well as the output voltage signal $V_1$ output from the signal correction unit 15 during application of the gradually decreasing measured electromagnetic field B, and outputs the average of the output voltage signals as the output voltage signal $V_1$ to the fitting factor calculation unit 35. Alternatively, a digital multimeter may be provided in place of the voltage measurement unit 34 to provide the measured voltage to the fitting factor calculation unit 35 in the control unit 30.

After obtaining the measurement result (the measured value data) with the horizontal axis indicating the electric current supplied from the measured electromagnetic field-generating constant current source 31 to the solenoid coil 22, i.e., the measured electromagnetic field B applied to the current detection device 10 in the solenoid coil 22 and the vertical axis indicating the output voltage signal $V_1$ from the current detection device 10 measured by the voltage measurement unit 34, the fitting factor calculation unit 35 calculates the factors (output offset factor $V_{off}$, saturation output factor $V_{sat}$, bias magnetic field strength factor $B_b$, angular offset factor $\varphi$ of a direction of the measured electromagnetic field, angular offset factor $\alpha$ of a direction of the bias magnetic field) by fitting the measurement result to the formula (1) shown later.

The factor control unit 36 writes the factors (output offset factor $V_{off}$, saturation output factor $V_{sat}$, bias magnetic field strength factor $B_b$, angular offset factor $\varphi$ of a direction of the measured electromagnetic field, angular offset factor $\alpha$ of a direction of the bias magnetic field) calculated by the fitting factor calculation unit 35 on the storage unit 16 of the signal correction unit 15 and also sets the signal correction flag in the storage unit 16 to "1" to indicate that the factors are written.

Figure 4:
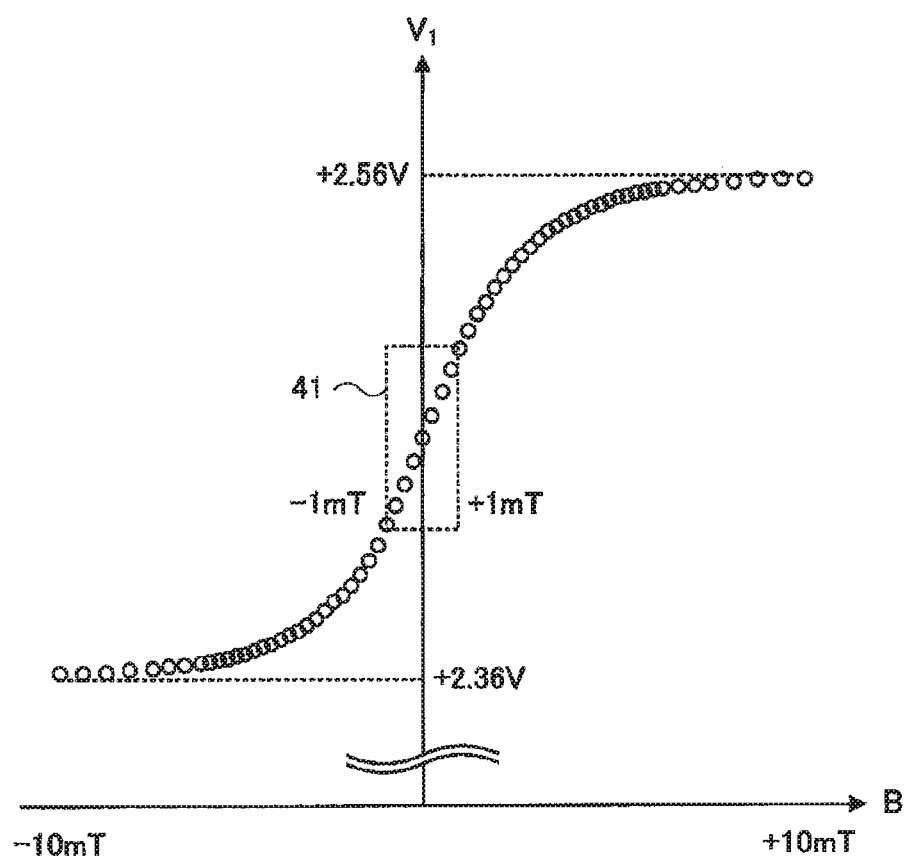
FIG. 4 is a diagram illustrating an example of measurement result, wherein the horizontal axis indicates measured electromagnetic field B and the vertical axis indicates output voltage signal $V_1$.

FIG. 4 is a diagram illustrating an example of the measurement result (the measured value data), wherein the horizontal axis indicates the measured electromagnetic field B and the vertical axis indicates the output voltage signal $V_1$.

In FIG. 4, the measured electromagnetic field B varies in a range of, e.g., −10 to +10 mT. Along with variation in the measured electromagnetic field B, the output voltage signal $V_1$ also varies in a range from, e.g., the minimum value of about +2.36V to the maximum value of about +2.56V and forms a curved line as shown in FIG. 4.

In FIG. 4, when the measured electromagnetic field B is in a range between about ±0.5 mT, the curved line has a linear range surrounded by a dotted rectangle 41 which is regarded as a region in which the output voltage signal $V_1$ changes approximately linearly. Conventionally, only the region surrounded by the dotted rectangle 41 is used, and the range of the magnetic flux density effectively detected by the magnetoresistance effect element is as very narrow as from −1 to +1 mT. The range of the output voltage signal $V_1$ is also as narrow as, e.g., about ±30 mV.

Figure 5:
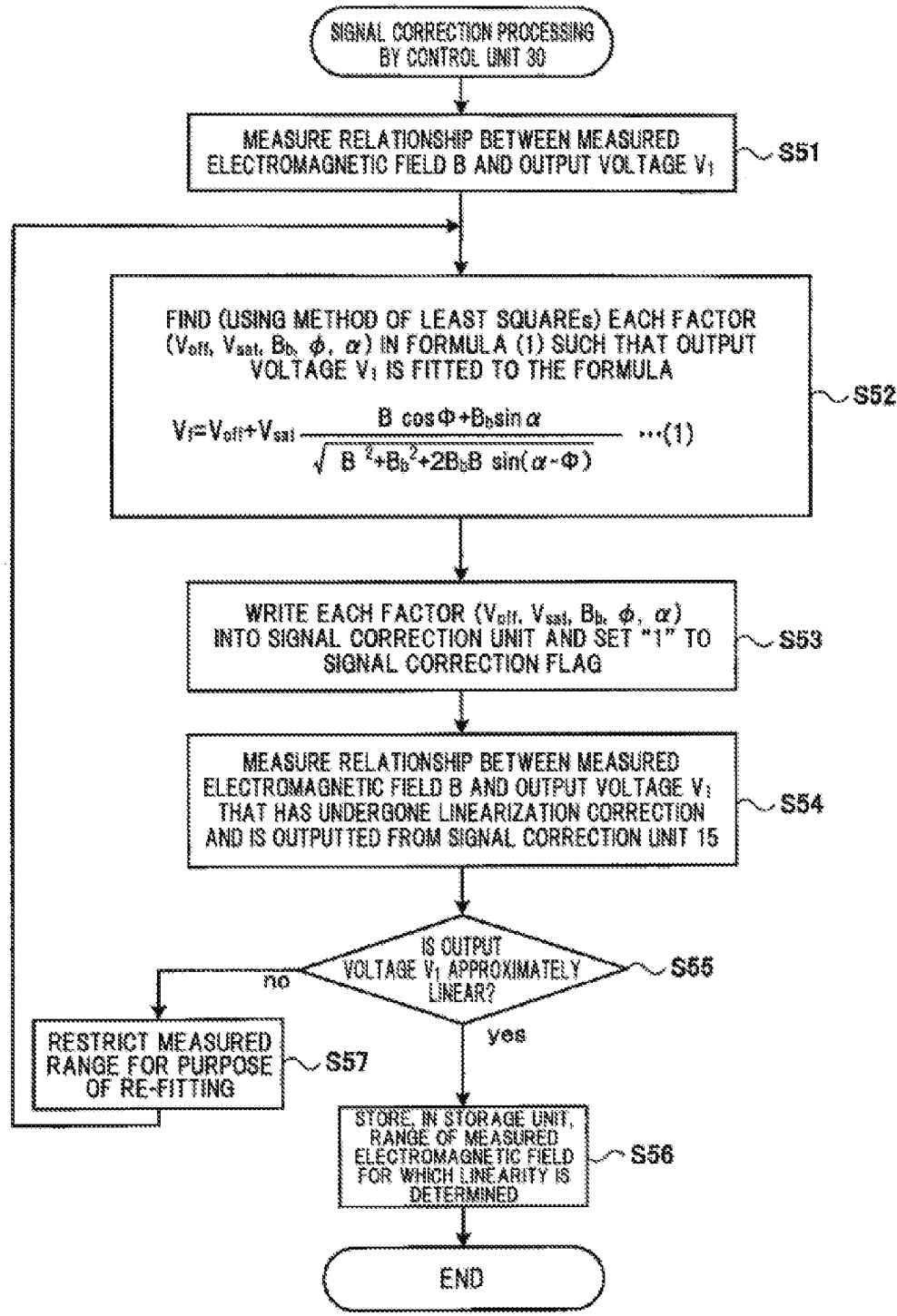
FIG. 5 is a flowchart showing an example of signal correction processing executed by a control unit shown in FIG. 2.
Figure 6:
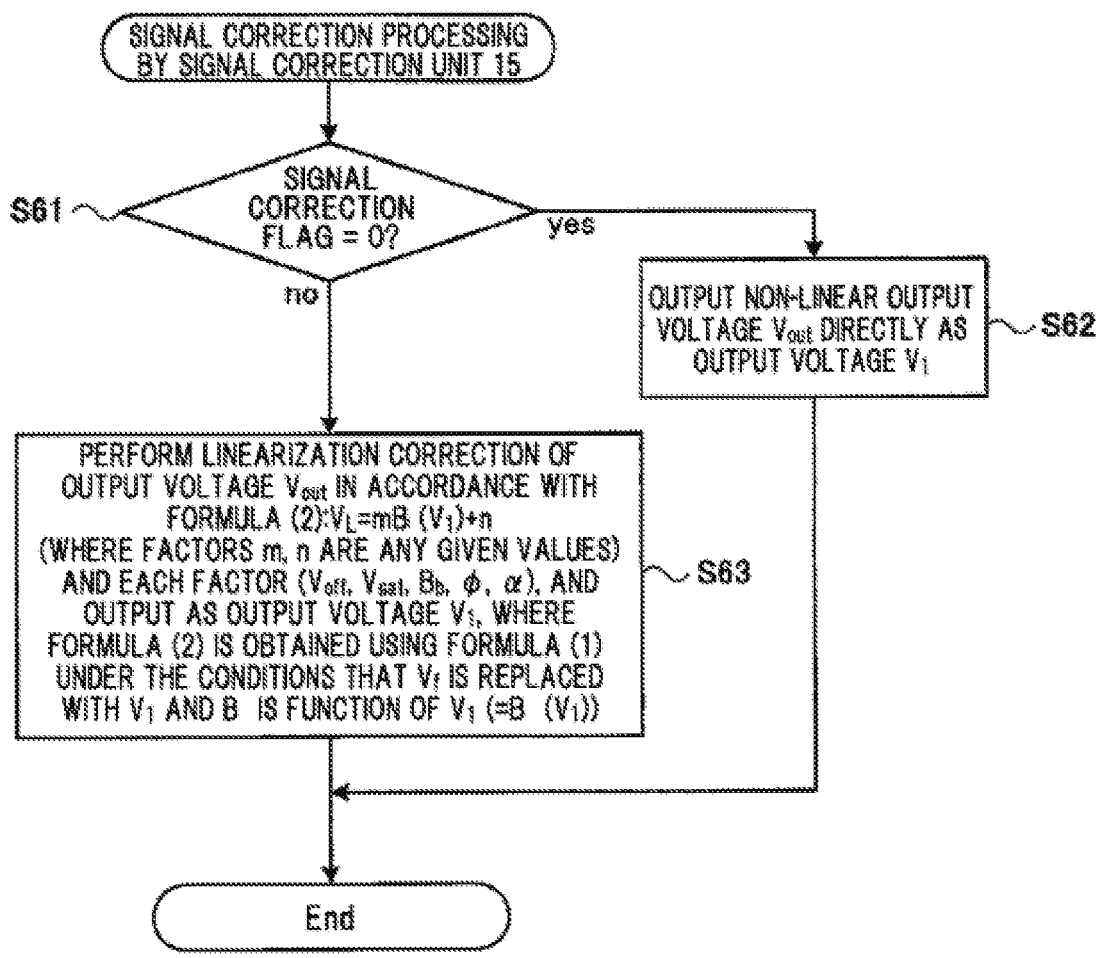
FIG. 6 is a flowchart showing an example of signal correction processing executed by a signal correction unit shown in FIG. 2.
Figure 8:
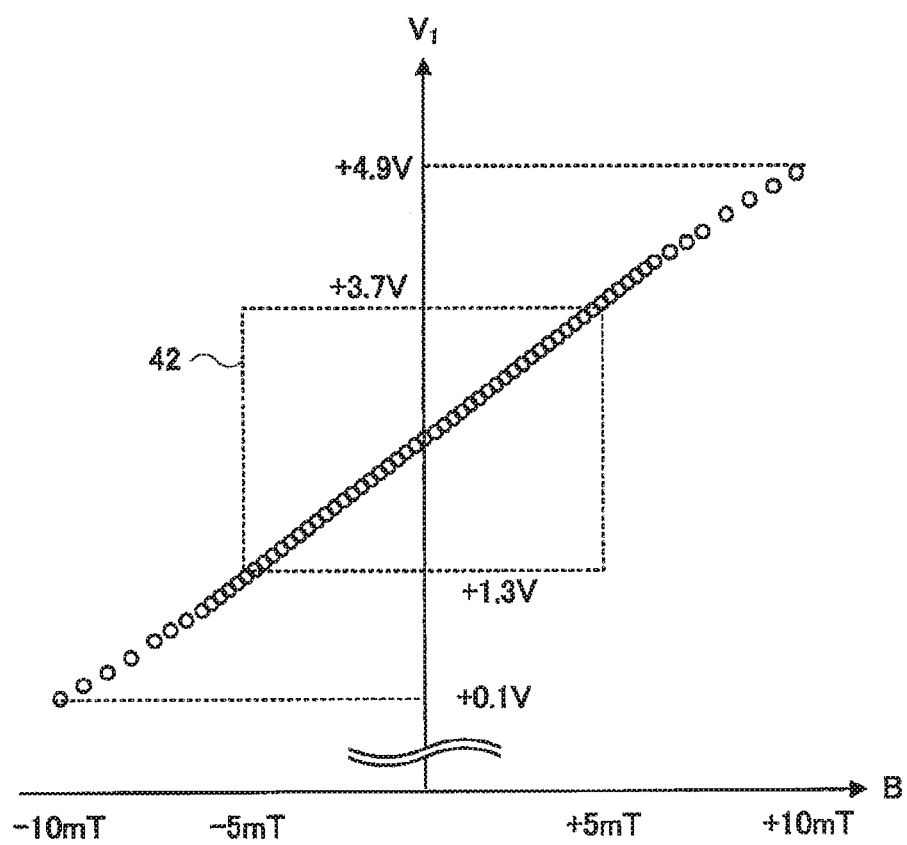
FIG. 8 is a diagram illustrating an example of the output voltage signal $V_1$ corrected to be approximately linear in the signal correction processing executed by the signal correction unit shown in FIG. 2.

FIG. 5 is a flowchart showing an example of signal correction processing executed by the control unit 30 shown in FIG. 2. FIG. 6 is a flowchart showing an example of signal correction processing executed by the signal correction unit 15 shown in FIG. 2. FIG. 7 is a diagram illustrating a relationship of the bias magnetic field $B_b$, the measured electromagnetic field B and the measured magnetic field B with respect to the magnetism detection elements 11 and 12 in the current detection device 10. FIG. 8 is a diagram illustrating an example of the output voltage signal $V_1$ corrected to be approximately linear in the signal correction processing executed by the signal correction unit 15 shown in FIG. 2.

The signal correction processing shown in FIG. 5 will be described below. In Step 51 in the signal correction processing by the control unit 30 in FIG. 5, the control unit 30 controls the measured electromagnetic field-generating constant current source 31 to continuously supply an electric current increasing and decreasing in a range of, e.g., about ±1000 mA so that the magnetic field in the solenoid coil 22 of the magnetic field generator 20 has a magnetic flux density detectable by the magnetism detection elements 11 and 12 of the current detection device 10, and the output voltage signal $V_1$ from the current detection device 10 which has a relation to the measured electromagnetic field B as shown in FIG. 4 is obtained.

At this stage, since the factors are not stored in the storage unit 16 of the signal correction unit 15 yet and the signal correction flag is thus set to "0", the non-linear output voltage signal $V_{out}$ as shown in FIG. 4 is directly output as the output voltage signal $V_1$ from the signal correction unit 15.

In Step 52 in the signal correction processing by the control unit 30 in FIG. 5, the fitting factor calculation unit 35 in the control unit 30 calculates the factors (output offset factor $V_{off}$, saturation output factor $V_{sat}$, bias magnetic field strength factor $B_b$, angular offset factor $\varphi$ of a direction of the measured electromagnetic field, angular offset factor $\alpha$ of a direction of the bias magnetic field) using the method of least squares so that $V_f$ in the following formula (1) is fitted to the waveform of the output voltage signal $V_1$ obtained in Step S51.

$$V_f = V_{off} + V_{sat} \frac{B\cos\phi + B_b\sin\alpha}{\sqrt{B^2 + B_b^2 + 2B_bB\sin(\alpha - \phi)}} \quad (1)$$

The output offset factor $V_{off}$ in the formula (1) is an output voltage value about which the non-linear output voltage signal $V_1$ as shown in FIG. 4 is substantially point-symmetric. In case of FIG. 4, since the minimum value is about +2.36V and the maximum value is about +2.56V, the output offset factor $V_{off}$ is about +2.46V.

The saturation output factor $V_{sat}$ in the formula (1) is an output voltage value at which non-linear output voltage signal $V_1$ as shown in FIG. 4 has a maximum value and a minimum value. In case of FIG. 4 in which the minimum value is about +2.36V, the maximum value is about +2.56V and the output offset is about +2.46V, the saturation output factor $V_{sat}$ is about 100 mV.

The relationship between the bias magnetic field strength factor $B_b$, the angular offset factor $\varphi$ of a direction of the measured electromagnetic field and the angular offset factor $\alpha$ of a direction of the bias magnetic field in the formula (1) will be described in reference to FIG. 7.

As shown in FIG. 7, the magnetization direction $M_{p1}$ of the magnetic pinned layer of the magnetism detection element 11 is upward in the drawing, while the magnetization direction $M_{p2}$ of the magnetic pinned layer of the magnetism detection element 12 is downward in the drawing. The direction of the bias magnetic field $B_b$ is substantially orthogonal to the magnetization directions $M_{p1}$ and $M_{p2}$ and is rightward in the drawing.

The bias magnetic field $B_b$ here is generated by bias magnetic field-magnets provided in the vicinity of the magnetism detection elements 11 and 12. When a bias coil (not shown) provided in the current detection device 10 is alternatively used instead of the bias magnets, the bias magnetic field $B_b$ can be generated by supplying a constant current to the bias coil.

The bias magnetic field strength factor $B_b$ is strength of the bias magnetic field generated by the bias magnetic field-magnets or the bias coil.

The current detection device 10 is placed in the magnetic field generator 20 so that the magnetization directions $M_{p1}$ and $M_{p2}$ of the magnetic pinned layers are parallel to the direction of the measured electromagnetic field B in the solenoid coil 22. However, in practice, the current detection device 10 may be offset by an angle $\varphi$ due to inaccuracy of installation. The angle $\varphi$ of the measured electromagnetic field B with respect to the magnetization directions $M_{p1}$ and $M_{p2}$ in such a case is defined as the angular offset factor $\varphi$ of a direction of the measured electromagnetic field. The angular offset factor $\varphi$ of a direction of the measured electromagnetic field has a positive value in a counterclockwise direction from the magnetization directions $M_{p1}$ and $M_{p2}$.

The direction of the bias magnetic field $B_b$ applied to the magnetism detection elements 11 and 12 in the current detection device 10 is substantially orthogonal to the magnetization directions $M_{p1}$ and $M_{p2}$ of the magnetic pinned layers but, in some cases, is offset by an angle $\alpha$ due to inaccuracy of installation of the magnetic field-magnets or due to manufacturing tolerance of the bias coil (difference between individual pieces). The angle $\alpha$ of the bias magnetic field $B_b$ with respect to the line orthogonal to the magnetization directions $M_{p1}$ and $M_{p2}$ in such a case is defined as the angular offset factor $\alpha$ of a direction of the bias magnetic field. The angular offset factor $\alpha$ of a direction of the bias magnetic field has a positive value in a counterclockwise direction from a direction perpendicular to the magnetization directions $M_{p1}$ and $M_{p2}$.

In the magnetism detection element 11 of the current detection device 10, the measured magnetic field B produced by combining the measured electromagnetic field B with the bias magnetic field $B_b$ is offset from the magnetization direction $M_{p1}$ in a clockwise direction by an angle $\theta 1$. Meanwhile, in the magnetism detection element 12 of the current detection device 10, the measured magnetic field B produced by combining the measured electromagnetic field B with the bias magnetic field $B_b$ is offset from the magnetization direction $M_{p2}$ in a counterclockwise direction by an angle $\theta 2$. Then, the direction and magnitude of the synthetic magnetic field $B_0$ are the same in the two magnetism detection elements 11 and 12.

The fitting factor calculation unit 35 in the control unit 30 performs fitting processing across the entire measurement range, e.g., from −10 to +10 mT and thereby calculates the factors (output offset factor $V_{off}$, saturation output factor $V_{sat}$, bias magnetic field strength factor $B_b$, angular offset factor $\varphi$ of a direction of the measured electromagnetic field, angular offset factor $\alpha$ of a direction of the bias magnetic field) in the formula (1).

In Step 53 in the signal correction processing by the control unit 30 in FIG. 5, the factor control unit 36 writes the factors (output offset factor $V_{off}$, saturation output factor $V_{sat}$, bias magnetic field strength factor $B_b$, angular offset factor $\varphi$ of a direction of the measured electromagnetic field, angular offset factor $\alpha$ of a direction of the bias magnetic field) calculated by the fitting factor calculation unit 35 on the storage unit 16 of the signal correction unit 15 and also sets the signal correction flag in the storage unit 16 to "1".

In Step 54 in the signal correction processing by the control unit 30 in FIG. 5, the control unit 30 controls the measured electromagnetic field-generating constant current source 31 to supply an electric current between, e.g., about ±1000 mA to the solenoid coil 22 of the magnetic field generator 20, and measures a relationship of the output voltage signal $V_1$ from the current detection device 10 with respect to the measured electromagnetic field B, in the same manner as Step S51.

In Step S53, the signal correction flag in the storage unit 16 is set to "1", and the factors (output offset factor $V_{off}$, saturation output factor $V_{sat}$, bias magnetic field strength factor $B_b$, angular offset factor φ of a direction of the measured electromagnetic field, angular offset factor α of a direction of the bias magnetic field) are stored in the storage unit 16 of the signal correction unit 15. Therefore, the signal correction unit 15 corrects the non-linear output voltage signal $V_{out}$ as shown in FIG. 4 by performing the signal correction processing shown in FIG. 6 and outputs the output voltage signal $V_1$ corrected to be approximately linear as shown in FIG. 8.

In Step 55 in the signal correction processing by the control unit 30 in FIG. 5, it is determined whether or not the output voltage signal $V_1$ corrected to be approximately linear and output from the signal correction unit 15 varies approximately linearly, i.e., whether or not the output voltage signal $V_1$ is approximately linear. Then, the process proceeds to Step S56 when approximately linear (yes) and proceeds to Step S57 when not approximately linear (no).

The determination is "yes" when it is linear in the range with the measured electromagnetic field B between, e.g., ±5 mT which is surrounded by a dotted rectangle 42 as shown in FIG. 8, and the determination is "no" when it is not linear. As shown in FIG. 8, the output voltage signal $V_1$ corrected to be approximately linear by the signal correction unit 15 forms an approximately linearly varying line in a wide range surrounded by the dotted rectangle 42 with the measured electromagnetic field B between about ±5 mT. Based on this, it is understood that the range of the output voltage signal $V_1$ is also extended to, e.g., ±3.7V.

In Step 56 in the signal correction processing by the control unit 30 in FIG. 5, since the determination in the previous Step S55 is linear (yes), the measured electromagnetic field range ±B regarded as a range with approximately linear variation, e.g., the range between ±5 mT, is written on the storage unit 16 and the signal correction processing is ended.

In Step 57 in the signal correction processing by the control unit 30 in FIG. 5, on the other hand, since the determination in the previous Step S55 is non-linear (no), the process returns to Step S52 to perform the fitting processing again using a limited measurement range.

The fitting factor calculation unit 35 in the control unit 30 performs the fitting process across the entire measurement range, e.g., from −10 to +10 mT. Then, in case that the determination in Step S55 is non-linear (no), the fitting factor calculation unit 35 limits the measurement range to, e.g., −8 to +8 mT and calculates the factors (output offset factor $V_{off}$, saturation output factor $V_{sat}$, bias magnetic field strength factor $B_b$, angular offset factor φ of a direction of the measured electromagnetic field, angular offset factor α of a direction of the bias magnetic field) of the formula (1) again by performing the fitting process in Step S52.

It has been found that when gradually limiting the measurement range used in the fitting process as described above, the linearity in a range with the measured electromagnetic field B between about ±5 mT is improved. Therefore, when the entire measurement range is, e.g., −10 to +10 mT, it is desirable to limit the measurement range at a predetermined rate, such that the next measurement range is −9 to +9 mT and the following measurement range is −8 to +8 mT.

When the determination result in the Step S55 after the re-fitting process is non-linear (no), the control unit 30 may perform the process in such a manner that the measurement range which can be regarded as linear is extracted, the extracted measurement range is written as the measurable range of the current detection device 10 on the storage unit 16 and the signal correction processing is ended. In this case, the measurable range of the current detection device 10 can be easily identified by reading the measurement range stored in the storage unit 16.

Next, the signal correction processing by the signal correction unit 15 in the current detection device 10 shown in FIG. 6 will be described in detail.

In Step 61 in the signal correction processing by the signal correction unit 15 in FIG. 6, the signal correction unit 15 determines whether or not the signal correction flag in the storage unit 16 is set to "0", and the process proceeds to Step S62 when "0" (yes) and proceeds to Step S63 when "1" (no).

In Step 62 in the signal correction processing by the signal correction unit 15 in FIG. 6, since the signal correction flag is set to "0", the non-linear output voltage signal $V_{out}$ as shown in FIG. 4 is directly output as the output voltage signal $V_1$ from the signal correction unit 15 to the voltage measurement unit 34.

In Step 63 in the signal correction processing by the signal correction unit 15 in FIG. 6, since the signal correction flag is set to "1", the output voltage signal $V_{out}$ is corrected to be approximately linear and the corrected voltage signal $V_1$ is output as the output voltage signal $V_1$.

In detail, the signal correction unit 15 preliminarily stores the following formula (2) which is obtained using the formula (1) under the conditions that the $V_f$ is replaced with $V_1$ and the measured magnetic field B is a function of $V_1$ ($=B(V_1)$).

$$V_L = m \times B(V_1) + n \qquad (2)$$

(where the factor m is any given value except 0, and the factor n is any given value)

Thus, in the signal correction processing executed by the signal correction unit 15, the output voltage signal $V_{out}$ is corrected to be approximately linear based on the formula (2) and the factors (output offset factor $V_{off}$, saturation output factor $V_{sat}$, bias magnetic field strength factor $B_b$, angular offset factor φ of a direction of the measured electromagnetic field, angular offset factor α of a direction of the bias magnetic field) stored in the storage unit 16, and the corrected voltage signal $V_L$ obtained by the correction is output as the output voltage signal $V_1$ as shown in FIG. 8.

Second Embodiment

Figure 9:
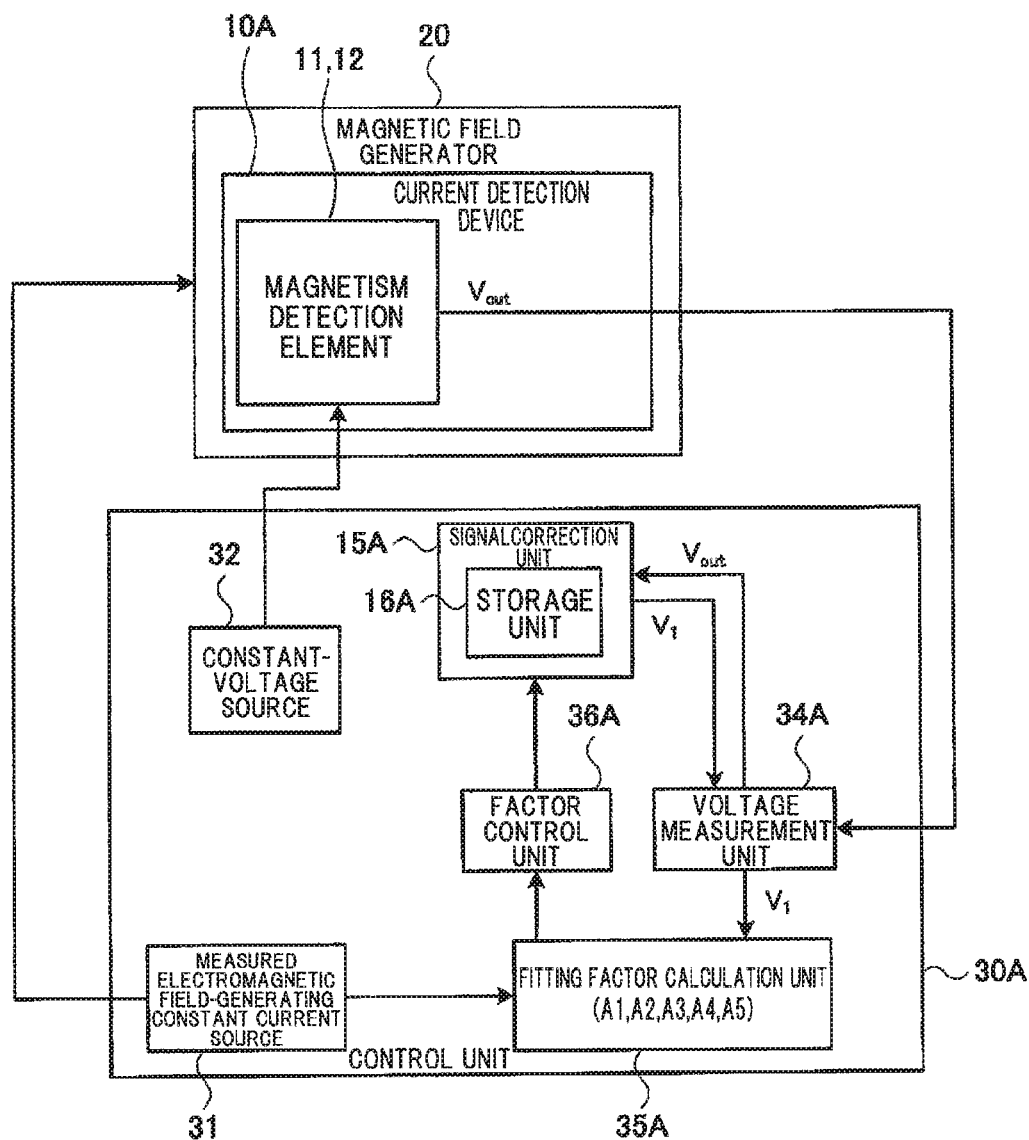
FIG. 9 is a schematic diagram illustrating a configuration of the current detection method, the signal correction method for the current detection device and a signal correction device for the current detection device in the second embodiment of the invention.

Next, the second embodiment of the invention will be described in reference to FIG. 9. FIG. 9 is a schematic diagram illustrating a configuration of the current detection method, the signal correction method for the current detection device and a signal correction device for the current detection device in the second embodiment of the invention, and corresponds to FIG. 2. A current detection device 10A and a control unit 30A in the second embodiment are configured differently from the current detection device 10 and the control unit 30 in the first embodiment, and the remaining configuration is the same. The configurations of the current detection device 10A and the control unit 30A which are the different features will be mainly described below. The same constituent elements as those of the first embodiment are denoted by the same reference numerals and the explanation thereof are omitted.

The current detection device 10A of FIG. 9 has the magnetism detection elements 11 and 12 in a half-bridge configuration on one chip. The current detection device 10A directly outputs the output voltage signal $V_{out}$ from a junction of the half-bridge configuration. Since the current detection device 10A is not provided with the signal correction unit 15 as shown in FIG. 2, a signal correction device 15A is formed for the current detection device 10A and is connected to the current detection device 10A in the second embodiment. The signal correction device 15A has the same structure as the signal correction unit 15 in the first embodiment. The output voltage signal $V_{out}$ output from the current detection device 10A is input to the signal correction device 15A which then outputs the corrected output voltage signal $V_L$ corrected to vary approximately linearly based on the predetermined factors.

That is, the signal correction device for a current detection device in the second embodiment of the invention is provided exclusively for the current detection device 10A, is a signal correction device from which the output voltage signal $V_{out}$ output from the current detection device 10A is output as the corrected output voltage signal $V_L$ corrected to vary approximately linearly based on the predetermined factors, and the signal correction device is a single element mounted on a separate chip from that mounting the current detection device 10A.

The control unit 30A in FIG. 9 is provided with the measured electromagnetic field-generating constant current source 31, the constant-voltage source 32, a voltage measurement unit 34A, a fitting factor calculation unit 35A and a factor control unit 36A. The configurations of the measured electromagnetic field-generating constant current source 31 and the constant-voltage source 32 are the same as those in the first embodiment.

The voltage measurement unit 34A directly outputs the output voltage signal $V_{out}$ from the current detection device 10A to an input terminal of the signal correction device 15A, receives the corrected output signal $V_1$ accordingly output from the signal correction device 15A, and acquires the measurement result (the measured value data) with the horizontal axis indicating the measured electromagnetic field B and the vertical axis indicating the output voltage signal $V_1$ as shown in FIG. 4.

At this time, the voltage measurement unit 34A measures the output voltage signal $V_{out}$ output from the current detection device 10A during application of the gradually increasing measured electromagnetic field B as well as the output voltage signal $V_{out}$ output from the current detection device 10A during application of the gradually decreasing measured electromagnetic field B, and outputs the average of the output voltage signals $V_{out}$ as the output voltage signal $V_1$ to the fitting factor calculation unit 35A.

The signal correction device 15A is connected to the voltage measurement unit 34A and the factor control unit 36A, etc., in the control unit 30A via a chip connection means provided on the control unit 30A. The signal correction device 15A corrects the output voltage signal $V_{out}$ from the current detection device 10A based on various factors (A1 to A5) stored in a storage unit 16A, and then outputs the corrected signal as the output voltage signal $V_1$. A signal correction flag is provide in the storage unit 16 A. The signal correction flag=0 indicates that the predetermined factors are not stored, and the signal correction flag=1 indicates that the predetermined factors are stored.

When the signal correction flag is set to "0", the signal correction device 15A directly outputs the output voltage signal $V_{out}$ from the voltage measurement unit 34A as the output voltage signal $V_1$ back to the voltage measurement unit 34A. On the other hand, when the signal correction flag is set to "1", the signal correction device 15A corrects the output voltage signal $V_{out}$ from the voltage measurement unit 34A and then outputs the corrected signal as the output voltage signal $V_1$ back to the voltage measurement unit 34A. The details of the factors (A1 to A5) stored in a storage unit 16A will be described later.

The fitting factor calculation unit 35A calculates the factors (A1 to A5) by computational processing which is performed so that the measurement result with the horizontal axis indicating the electric current supplied from the measured electromagnetic field-generating constant current source 31 to the solenoid coil 22, i.e., the measured electromagnetic field B applied to the current detection device 10 in the solenoid coil 22 and the vertical axis indicating the output voltage signal $V_1$ from the current detection device 10A measured by the voltage measurement unit 34A is fitted to the following formula (3).

$$V_f = A1 + \frac{A4 \times B + A5}{\sqrt{B^2 + A2 \times B + A3}} \quad (3)$$

Regarding the factors in the formula (3), the factor A1 corresponds to $V_{off}$ in the formula (1), the factor A2 corresponds to $2 \cdot B_b \cdot \sin(\alpha-\varphi)$ which is a factor of the measured magnetic field B within the radical symbol in the formula (1), the factor A3 corresponds to a square of $B_b$ within the radical symbol in the formula (1), the factor A4 corresponds to $V_{sat} \cdot \cos \varphi$ which is a factor of the measured magnetic field B above the line (numerator) in the formula (1), and the factor A5 corresponds to $B_b \cdot V_{sat} \cdot \sin \alpha$ above the line (numerator) in the formula (1). That is, the factors A1 to A5 respectively depend on the output offset factor $V_{off}$, the saturation output factor $V_{sat}$, the bias magnetic field strength factor $B_b$, the angular offset factor $\varphi$ of a direction of the measured electromagnetic field and the angular offset factor $\alpha$ of a direction of the bias magnetic field which are described above, and the formula (1) is substantially the same as the formula (3).

The fitting factor calculation unit 35A calculates the factors (A1 to A5) using the method of least squares so that $V_f$ in the following formula (3) is fitted to the waveform of the output voltage signal $V_1$ across the entire measurement range, e.g., from −10 to +10 mT, in the same manner as the first embodiment. In this case, since the fitting factor calculation unit 35A needs to simply calculate only the factors, the computational processing can be simplified and speeded up.

The factor control unit 36A writes the factors A1 to A5 of the formula (3) calculated by the fitting factor calculation unit 35A on the storage unit 16A of the signal correction device 15A and also sets the signal correction flag in the storage unit 16A to "1". Since the signal correction device 15A and the current detection device 10A are mounted on the separate chips in the second embodiment, the factor control unit 36A is preferably configured to control the storage unit 16A to store, e.g., an ID number identifying the chip mounting the current detection device 10A subjected to signal correction. This allows the current detection device 10A to be associated one-to-one with the signal correction device 15A.

Since the signal correction processing executed by the control unit 30A of FIG. 9 and the signal correction processing executed by the signal correction device 15A of FIG. 9 in the second embodiment are the same as those shown in FIGS. 5 and 6 except that the factors A1 to A5 calculated by the fitting factor calculation unit 35A are different, the explanation thereof are omitted.

The current detection method, the signal correction method for a current detection device and the signal correction device for the current detection device in the second embodiment are applicable to a current detection device already installed on an object to be measured or a current detection device not having a signal correction unit. For example, the signal correction device 15A can be connected to an existing current detection device already provided on a motor drive of a hybrid car or electric car, or on a solar battery, to appropriately correct output signals thereof.

Although the half-bridge configuration of the magnetism detection elements 11 and 12 has been described as an example in the embodiments, it is not limited thereto. For example, the configuration may be a full-bridge configuration of four magnetism detection elements connected in a bridge configuration, or may be formed of one magnetism detection element.

Although the control units 30 and 30A as a control computer of which basic structure is a personal computer (PC) have been described in the embodiments, the control units 30 and 30A may be constructed from a microcomputer with one chip configuration.

In the embodiments, the magnetic field generator 20 provided with the solenoid coil 22 has been described as an example. However, in case that it is difficult to provide the solenoid coil 22 to house a device such as a current detection device already installed on an object to be measured, magnetic flux density for measurement can be produced by passing a predetermined electric current through the object to be measured. In this case, the control units 30 and 30A can direct the operation by outputting a current control signal to the object to be measured.

Functions and Effects of the First and Second Embodiments

The following functions and effects are obtained in the first and second embodiments described above.

(1) The signal correction unit 15/the signal correction device 15A corrects the output voltage signal $V_{out}$ from the current detection device 10/10A based on the factors (output offset factor $V_{off}$, saturation output factor $V_{sat}$, bias magnetic field strength factor $B_b$, angular offset factor $\varphi$ of a direction of the measured electromagnetic field, angular offset factor $\alpha$ of a direction of the bias magnetic field/A1 to A5) stored in a storage unit 16/16A, and then outputs the corrected signal as the output voltage signal $V_1$. At this time, the fitting factor calculation unit 35/35A in the control unit 30/30A calculates the factors using the method of least squares so that $V_f$ in the formula (1) or (3) is fitted to the waveform of the output voltage signal $V_1$. Therefore, the corrected voltage signal $V_1$ from the signal correction unit 15/the signal correction device 15A is output so that the relationship of output voltage to magnetic flux density is approximately linear with very high linearity, and moreover, the range of the corrected voltage signal $V_1$ can be also expanded.

(2) In the formula (1), the output offset factor $V_{off}$ is an output voltage value about which the non-linear output voltage signal $V_1$ as shown in FIG. 4 is substantially point-symmetric, the saturation output factor $V_{sat}$ is an output voltage value at which the non-linear output voltage signal $V_1$ as shown in FIG. 4 has a maximum value and a minimum value, the bias magnetic field strength factor $B_b$ is strength of the bias magnetic field generated by the bias magnetic field-magnets or the bias coil, the angular offset factor $\varphi$ of a direction of the measured electromagnetic field is an angle of the measured electromagnetic field B with respect to the magnetization directions $M_{p1}$ and $M_{p2}$, and the angular offset factor $\alpha$ of a direction of the bias magnetic field is an angle of the bias magnetic field $B_b$ with respect to the line orthogonal to the magnetization directions $M_{p1}$ and $M_{p2}$. Since these factors correspond to the actual configuration of the magnetism detection elements 11 and 12, the corrected voltage signal $V_1$ output from the signal correction unit 15/the signal correction device 15A is an approximately linear output with higher linearity due to use of the factors which are calculated so as to fit the measured value data.

(3) In the signal correction processing executed by the signal correction unit 15/the signal correction device 15A, the output voltage signal $V_{out}$ is corrected to be approximately linear based on the formula (2) and the factors (output offset factor $V_{off}$, saturation output factor $V_{sat}$, bias magnetic field strength factor $B_b$, angular offset factor $\varphi$ of a direction of the measured electromagnetic field, angular offset factor $\alpha$ of a direction of the bias magnetic field) stored in a storage unit 16/16A, and the corrected voltage signal $V_L$ is output as the output voltage signal $V_1$. Since the formula (2) used here is obtained using the formula (1) under the conditions that the $V_f$ is replaced with $V_1$ and the measured magnetic field B is a function of $V_1$ ($B(V_1)$), the corrected voltage signal $V_1$ output from the signal correction unit 15 is an approximately linear output with higher linearity.

(4) In the signal correction processing executed by the signal correction device 15A, the output voltage signal $V_{out}$ is corrected to be approximately linear based on the formula (3) and the factors (A1 to A5) stored in a storage unit 16A, and the corrected voltage signal $V_L$ is output as the output voltage signal $V_1$. Regarding the factors in the formula (3), the factor A1 corresponds to $V_{off}$ in the formula (1), the factor A2 corresponds to $2 \cdot B_b \cdot \sin(\alpha-\varphi)$ which is a factor of the measured magnetic field B within the radical symbol in the formula (1), the factor A3 corresponds to a square of $B_b$ within the radical symbol in the formula (1), the factor A4 corresponds to $V_{sat} \cdot \cos \varphi$ which is a factor of the measured magnetic field B above the line (numerator) in the formula (1), and the factor A5 corresponds to $B_b \cdot V_{sat} \cdot \sin \alpha$ above the line (numerator) in the formula (1). Therefore, the corrected voltage signal $V_1$ output from the signal correction unit 15A is an approximately linear output with higher linearity.

(5) Both in the configuration shown in FIG. 2 in which the current detection device 10 has the magnetism detection elements 11, 12 and the signal correction unit 15 on one chip and in the configuration shown in FIG. 9 in which the current detection device 10A only has the magnetism detection elements 11 and 12 mounted on one chip and the signal correction device 15A is mounted on a separate chip from that mounting the current detection device 10A, the signal correction unit 15/the signal correction device 15A corrects the output voltage signal $V_{out}$ from the current detection device 10/10A based on the factors (output offset factor $V_{off}$, saturation output factor $V_{sat}$, bias magnetic field strength factor $B_b$, angular offset factor $\varphi$ of a direction of the measured electromagnetic field, angular offset factor α of a direction of the bias magnetic field/A1 to A5) stored in a storage unit 16/16A, and then outputs the corrected signal as the corrected voltage signal $V_1$. Therefore, the corrected voltage signal $V_1$ is an approximately linear output with higher linearity.

(6) By using the signal correction unit 15A which is mounted on a separate chip from that mounting the current detection device 10A as shown in FIG. 9, the output voltage signal $V_{out}$ output from the current detection device 10A is output as the corrected output voltage signal $V_L$ corrected to vary approximately linearly based on the predetermined factors. Therefore, an approximately linear corrected voltage signal with higher linearity can be output in the same manner even to, e.g., a current detection device already installed on an object to be measured such as a motor drive of a hybrid car or electric car, etc., or a solar battery, or to a current detection device not having a signal correction unit.

(7) It is determined whether or not the output voltage signal $V_1$ corrected to be approximately linear and output from the signal correction unit 15/the signal correction device 15A varies approximately linearly, i.e., whether or not the output voltage signal $V_1$ is approximately linear, and the measured electromagnetic field range ±B regarded as a range with approximately linearly variation is written on the storage unit 16/16A when the determination is linear (yes), and the fitting processing is performed again using a limited measurement range when the determination is not linear (no). Therefore, the corrected voltage signal $V_1$ is an approximately linear output with higher linearity. In addition, since the measured electromagnetic field range ±B is written on the storage unit 16/16A, the measurement range of the current detection device 10/10A can be easily identified by reading out the range ±B from the storage unit 16/16A.

SUMMARY OF THE EMBODIMENTS

Technical ideas understood from the embodiments will be described below citing the reference numerals, etc., used for the embodiments. However, each reference numeral described below is not intended to limit the constituent elements in the claims to the members, etc., specifically described in the embodiments.

[1] A current detection method for a current detection device (10/10A) comprising magnetism detection elements (11, 12) that detect magnetic flux density (B) and output a voltage signal ($V_{out}$) corresponding to the magnetic flux density (B), the method comprising: acquiring measured value data that is obtained as a result of providing magnetic flux density (B) in a detectable range of the magnetism detection elements (11, 12) and indicates the relationship between the magnetic flux density (B) and an output voltage signal ($V_1$) from the current detection device (10/10A); performing computational processing so as to fit the acquired measured value data to a formula that includes a plurality of factors ($V_{off}$, $V_{sat}$, $B_b$, φ, α/A1 to A5) for a measured magnetic field B and indicates the an output voltage signal $V_f$ of the magnetism detection elements (11, 12), thereby calculating the plurality of factors ($V_{off}$, $V_{sat}$, $B_b$, φ, α/A1 to A5); and correcting the output voltage signal ($V_1$) from the magnetism detection elements (11, 12) in accordance with the calculated plurality of factors ($V_{off}$, $V_{sat}$, $B_b$, φ, α/A1 to A5) so as to be approximately linear with respect to the magnetic flux density (B), and then outputting a corrected voltage signal ($V_L$) obtained by the correction.

In this current detection method, a predetermined magnetic flux density (B) is provided to the current detection device (10) having the magnetism detection elements (11, 12) and the signal correction unit (15) on one chip or to the current detection device (10A) having only magnetism detection elements (11, 12) on one chip, the measured value data indicating the relationship between the magnetic flux density (B) and the output voltage signal ($V_1$) of the current detection device (10/10A) is thereby acquired, the factors ($V_{off}$, $V_{sat}$, $B_b$, φ, α/A1 to A5) are then calculated by performing the computational processing so as to fit the acquired measured value data to the predetermined formula (1) or (3), the output voltage signal ($V_1$) from the magnetism detection elements (11, 12) is corrected by the signal correction unit (15) or the signal correction device (15A) in accordance with the calculated factors so as to be approximately linear with respect to the magnetic flux density (B), and the resulting corrected voltage signal $V_L$ is output. As a result, the relationship of the output voltage ($V_1$) to the detected magnetic flux density (B) can be approximately linear with high linearity.

[2] The current detection method defined by [1], wherein the formula including the plurality of factors ($V_{off}$, $V_{sat}$, $B_b$, φ, α/A1 to A5) and indicating the output voltage signal $V_f$ of the magnetism detection elements (11, 12) is expressed by:

$$V_f = A1 + \frac{A4 \times B + A5}{\sqrt{B^2 + A2 \times B + A3}}$$

and each of the factors A1 to A5 is calculated so that the output voltage obtained by the formula is fitted to the measured value data.

In this current detection method, the computational processing is performed so as to fit the formula (3) to the measured value data. In this current detection method, the factors in the formula (1) are converted into and expressed by the factors A1 to A5 and the formula (3) as a function of the measured magnetic field B is obtained. The factors A1 to A5 depend on the factors ($V_{off}$, $V_{sat}$, $B_b$, φ, α) in the formula (1), derives the same result and can be calculated simply as the factors (A1 to A5). Therefore, it is possible to easily calculate the factors by using an existing spreadsheet software, etc.

[3] The current detection method defined by [2], wherein in the formula, the factor A1 is an output offset factor $V_{off}$, the factor A2 is $2 \cdot B_b \cdot \sin(α-φ)$, the factor A3 is a square of $B_b$, the factor A4 is $V_{sat} \cos φ$ and the factor A5 is $B_b \cdot V_{sat} \sin α$, and in the factors A2 to A5, $V_{sat}$ is a saturation output factor, $B_b$ is a bias magnetic field strength factor, φ is an angular offset factor of a direction of the measured electromagnetic field, and α is an angular offset factor of a direction of the bias magnetic field.

Since the factors ($V_{off}$, $V_{sat}$, $B_b$, φ, α) in the formula (1) correspond to the actual configuration of the magnetism detection elements (11, 12), the corrected voltage signal $V_1$ output from the signal correction unit (15)/the signal correction device (15A) is an approximately linear output with higher linearity due to use of the factors which are calculated so as to fit the measured value data.

[4] The current detection method defined by [2] or [3], wherein the corrected voltage signal ($V_L$) is output in accordance with a formula for expressing the corrected voltage signal $V_L = m \times B(V_1) + n$ (where the factor m is any given value except 0, and the factor n is any given value) and the plurality of factors ($V_{off}$, $V_{sat}$, $B_b$, φ, α/A1 to A5) calculated by the computational processing, the formula being obtained using the formula (1) under the conditions that the output voltage signal $V_f$ is replaced with an output voltage signal $V_1$ and a measured magnetic field B is a function of the output voltage signal $V_1$ (=B($V_1$)).

In this current detection method, a calculation formula used to correct the output voltage signal ($V_1$) from the magnetism detection elements (11, 12) by the signal correction unit (15/15A) based on the factors ($V_{off}$, $V_{sat}$, $B_b$, φ, α/A1 to A5) is specifically given as the formula (2). The formula (2) is obtained using the formula (1) or the formula (3) under the conditions that the output voltage signal $V_f$ is replaced with the output voltage signal $V_1$ and the measured magnetic field B is a function of the output voltage signal $V_1$ (=B($V_1$)).

[5] A current detection device (10/10A), comprising: magnetism detection elements (11, 12) that detect magnetic flux density (B) and output a voltage signal ($V_{out}$) corresponding to the magnetic flux density (B); and a signal correction means (15/15A) that corrects the output voltage signal ($V_1$) from the magnetism detection elements (11, 12) so as to be approximately linear with respect to the magnetic flux density (B) and then outputs a corrected voltage signal ($V_L$) obtained by the correction, the correction being performed in accordance with a plurality of factors ($V_{off}$, $V_{sat}$, $B_b$, φ, α/A1 to A5) calculated by computational processing that is performed so that measured value data obtained as a result of providing the magnetic flux density (B) to the magnetism detection elements (11, 12) and indicating the relationship between the magnetic flux density (B) and an output voltage signal ($V_1$) is fitted to a formula including the plurality of factors ($V_{off}$, $V_{sat}$, $B_b$, φ, α/A1 to A5) and indicating an output voltage signal $V_f$ of the magnetism detection elements (11, 12).

This current detection device (10/10A) corresponds to the current detection method defined by [1].

[6] The current detection device (10/10A) defined by [5], wherein the formula including the plurality of factors ($V_{off}$, $V_{sat}$, $B_b$, φ, α/A1 to A5) and indicating the output voltage signal $V_f$ of the magnetism detection elements (11, 12) is expressed by:

$$V_f = A1 + \frac{A4 \times B + A5}{\sqrt{B^2 + A2 \times B + A3}}$$

and each of the factors A1 to A5 is calculated so that the output voltage obtained by this formula is fitted to the measured value data.

This current detection device (10/10A) corresponds to the current detection method defined by [2].

[7] The current detection device (10/10A) defined by [6], wherein in the formula, the factor A1 is an output offset factor $V_{off}$, the factor A2 is $2 \cdot B_b \cdot \sin(\alpha - \varphi)$, the factor A3 is a square of $B_b$, the factor A4 is $V_{sat} \cos \varphi$ and the factor A5 is $B_b \cdot V_{sat} \sin \alpha$, and in the factors A2 to A5, $V_{sat}$ is a saturation output factor, $B_b$ is a bias magnetic field strength factor, φ is an angular offset factor of a direction of the measured electromagnetic field, and α is an angular offset factor of a direction of the bias magnetic field.

This current detection device (10/10A) corresponds to the current detection method defined by [3].

[8] The current detection device (10/10A) defined by [6], wherein the signal correction means (15) outputs the corrected voltage signal ($V_L$) in accordance with a formula: $V_L = m \times B(V_1) + n$ (where the factor m is any given value except 0, and the factor n is any given value) and the plurality of factors ($V_{off}$, $V_{sat}$, $B_b$, φ, α/A1 to A5) calculated by the computational processing, the formula being obtained using the formula (1) under the conditions that the output voltage signal $V_f$ is replaced with an output voltage signal $V_1$ and a measured magnetic field B is a function of the output voltage signal $V_1$ (=B($V_1$)).

This current detection device (10/10A) corresponds to the current detection method defined by [4].

[9] A signal correction method for a current detection device (10) comprising magnetism detection elements (11, 12) that detect magnetic flux density (B) and output a voltage signal ($V_{out}$) corresponding to the magnetic flux density (B) and a signal correction means (15) that comprises a storage unit (16) for storing a plurality of factors ($V_{off}$, $V_{sat}$, $B_b$, φ, α/A1 to A5) and is configured to directly output an output voltage signal ($V_1$) from the magnetism detection elements (11, 12) without change when the plurality of factors ($V_{off}$, $V_{sat}$, $B_b$, φ, α/A1 to A5) are not stored in the storage unit (16), and to correct an output voltage signal ($V_1$) from the magnetism detection elements (11, 12) and then output a corrected voltage signal ($V_L$) obtained by the correction when the plurality of factors ($V_{off}$, $V_{sat}$, $B_b$, φ, α/A1 to A5) are stored in the storage unit (16), the output voltage signal ($V_1$) being corrected in accordance with the plurality of factors ($V_{off}$, $V_{sat}$, $B_b$, φ, α/A1 to A5) so as to be approximately linear with respect to the magnetic flux density (B), the method for the current detection device (10) not storing the plurality of factors ($V_{off}$, $V_{sat}$, $B_b$, φ, α/A1 to A5) in the storage unit (16) of the signal correction means (15), and the method comprising: providing magnetic flux density (B) in a detectable range of the magnetism detection elements (11, 12); acquiring measured value data that is obtained as a result of providing the magnetic flux density (B) and indicates the relationship between the magnetic flux density (B) and an output voltage signal ($V_1$) from the current detection device (10); performing computational processing so as to fit the acquired measured value data to a formula that includes the plurality of factors ($V_{off}$, $V_{sat}$, $B_b$, φ, α/A1 to A5) and indicates the output voltage signal $V_f$ of the magnetism detection elements (11, 12), thereby calculating the plurality of factors ($V_{off}$, $V_{sat}$, $B_b$, φ, α/A1 to A5); and storing the calculated plurality of factors ($V_{off}$, $V_{sat}$, $B_b$, φ, α/A1 to A5) in the storage unit (16) of the signal correction means (15).

In this signal correction method for the current detection device (10), a predetermined magnetic flux density (B) is provided to the current detection device (10) having the magnetism detection elements (11, 12) and the signal correction unit (15) on one chip, the measured value data indicating the relationship between the magnetic flux density (B) and the output voltage signal ($V_1$) of the current detection device (10) is thereby acquired, the factors ($V_{off}$, $V_{sat}$, $B_b$, φ, α/A1 to A5) are then calculated by performing the computational processing so as to fit the acquired measured value data to the predetermined formula (1) or (3), the output voltage signal ($V_1$) from the magnetism detection elements (11, 12) is corrected by the signal correction unit (15) in accordance with the calculated factors so as to be approximately linear with respect to the magnetic flux density (B), and the resulting corrected voltage signal ($V_L$) is output. As a result, the relationship of the output voltage ($V_1$) to the detected magnetic flux density (B) can be approximately linear with high linearity.

[10] The signal correction method for a current detection device (10) defined by [9], comprising: after storing the plurality of factors ($V_{off}$, $V_{sat}$, $B_b$, φ, α/A1 to A5) in the storage unit (16) of the signal correction means (15), measuring the corrected voltage signal ($V_L$) obtained by providing the magnetic flux density (B) in a detectable range of the magnetism detection elements (11, 12) to the current detection device (10); determining whether or not the measured corrected voltage signal ($V_L$) is approximately linear; storing a measurement range of measured electromagnetic field in the storage unit (16) when approximately linear; performing the computational processing again using a limited range of measured electromagnetic field to calculate the plurality of factors ($V_{off}$, $V_{sat}$, $B_b$, φ, α/A1 to A5) when not approximately linear; and storing the calculated plurality of factors ($V_{off}$, $V_{sat}$, $B_b$, φ, α/A1 to A5) and the limited range of measured electromagnetic field in the storage unit (16) of the signal correction means (15).

In this signal correction method for the current detection device (10), it is determined whether or not the output voltage signal $V_1$ corrected to be approximately linear and output from the signal correction unit (15) varies approximately linearly, i.e., whether or not the output voltage signal $V_1$ is approximately linear, and the measured electromagnetic field range ±B regarded as a range with approximately linearly variation is written on the storage unit (16) when the determination is linear (yes), and the fitting processing is performed again using a limited measurement range when the determination is not linear (no). Therefore, the corrected voltage signal $V_1$ is an approximately linear output with higher linearity. In addition, since the measured electromagnetic field range ±B is written on the storage unit (16), the measurement range of the current detection device (10) can be easily identified by reading out the range ±B from the storage unit (16).

[11] A signal correction method for a current detection device (10A) comprising magnetism detection elements (11, 12) that detect magnetic flux density (B) and output a voltage signal ($V_{out}$) corresponding to the magnetic flux density (B), the method comprising: acquiring measured value data that is obtained as a result of providing magnetic flux density (B) in a detectable range of the magnetism detection elements (11, 12) and indicates the relationship between the magnetic flux density (B) and an output voltage signal ($V_1$) from the current detection device (10A); performing computational processing so as to fit the acquired measured value data to a formula that includes a plurality of factors ($V_{off}$, $V_{sat}$, $B_b$, φ, α/A1 to A5) and indicates the output voltage of the magnetism detection elements (11, 12), thereby calculating the plurality of factors ($V_{off}$, $V_{sat}$, $B_b$, φ, α/A1 to A5); storing the calculated plurality of factors ($V_{off}$, $V_{sat}$, $B_b$, φ, α/A1 to A5) in a storage unit (16A) of a signal correction means (15A) that corrects the output voltage signal ($V_1$) from the magnetism detection elements (11, 12) in accordance with the plurality of factors ($V_{off}$, $V_{sat}$, $B_b$, φ, α/A1 to A5) so as to be approximately linear with respect to magnetic flux density (B) and then outputs a corrected voltage signal ($V_L$) obtained by the correction; and using the signal correction means (15A) with the plurality of factors ($V_{off}$, $V_{sat}$, $B_b$, φ, α/A1 to A5) stored in the storage unit (16A) as a signal correction device (15A) for the current detection device (10A).

In this signal correction method for the current detection device (10A), by using the signal correction device 15A which is mounted on a separate chip from that mounting the current detection device 10A, the output voltage signal $V_{out}$ output from the current detection device 10A is output as the corrected output voltage signal $V_L$ corrected to vary approximately linearly based on the predetermined factors, and the signal correction method is performed in the same manner as the method defined by [9]. As a result, the relationship of the output voltage ($V_1$) to the detected magnetic flux density (B) can be made approximately linear with high linearity also in a current detection device already installed on an object to be measured or a current detection device (10A) not having a signal correction unit.

[12] The signal correction method for a current detection device (10A) defined by [11], comprising: after storing the plurality of factors ($V_{off}$, $V_{sat}$, $B_b$, φ, α/A1 to A5) in the storage unit (16A) of the signal correction means (15A), measuring the corrected voltage signal ($V_L$) obtained by providing the magnetic flux density (B) in a detectable range of the magnetism detection elements (11, 12) to the current detection device (10A); determining whether or not the measured corrected voltage signal ($V_L$) is approximately linear; storing a measurement range of measured electromagnetic field in the storage unit (16A) when approximately linear; performing the computational processing again using a limited range of measured electromagnetic field to calculate the plurality of factors ($V_{off}$, $V_{sat}$, $B_b$, φ, α/A1 to A5) when not approximately linear; storing the calculated plurality of factors ($V_{off}$, $V_{sat}$, $B_b$, φ, α/A1 to A5) and the limited range of measured electromagnetic field in the storage unit (16A) of the signal correction means (15A); and using the signal correction means (15A) with the plurality of factors ($V_{off}$, $V_{sat}$, $B_b$, φ, α/A1 to A5) and the limited range of measured electromagnetic field stored in the storage unit (16A) as a signal correction device (15A) for the current detection device (10A).

This signal correction method for the current detection device (10A) corresponds to the signal correction method for the current detection device (10) defined by [10].

[13] The signal correction method for a current detection device (10/10A) defined by any one of [9] to [12], wherein the formula including the plurality of factors ($V_{off}$, $V_{sat}$, $B_b$, φ, α/A1 to A5) for a measured magnetic field B and indicating the output voltage signal $V_f$ of the magnetism detection elements (11, 12) is expressed by $$V_f = A1 + \frac{A4 \times B + A5}{\sqrt{B^2 + A2 \times B + A3}}$$

and each of the factors A1 to A5 is calculated so that the output voltage signal $V_f$ of the formula is fitted to an output voltage signal of the measured value data.

This signal correction method for the current detection device (10/10A) corresponds to the current detection method defined by [2].

[14] The signal correction method for a current detection device (10/10A) defined by [13], wherein in the formula, the factor A1 is an output offset factor $V_{off}$, the factor A2 is $2 \cdot B_b \cdot \sin(\alpha - \varphi)$, the factor A3 is a square of $B_b$, the factor A4 is $V_{sat} \cdot \cos \varphi$ and the factor A5 is $B_b \cdot V_{sat} \cdot \sin \alpha$, and in the factors A2 to A5, $V_{sat}$ is a saturation output factor, $B_b$ is a bias magnetic field strength factor, φ is an angular offset factor of a direction of the measured electromagnetic field, and α is an angular offset factor of a direction of the bias magnetic field.

[15] The signal correction method for a current detection device (10/10A) defined by [13] or [14], wherein the signal correction means (15/15A) of the current detection device (10/10A) outputs the corrected voltage signal ($V_L$) in accordance with a formula $V_L = m \times B(V_1) + n$ (where the factor m is any given value except 0, and the factor n is any given value) and the plurality of factors ($V_{off}$, $V_{sat}$, $B_b$, φ, α/A1 to A5) calculated by the computational processing, the formula being obtained using the formula (1) under the conditions that the output voltage $V_f$ is replaced with an output voltage $V_1$ and a measured magnetic field B is a function of the output voltage $V_1$ (=B($V_1$)).

This signal correction method for the current detection device (10/10A) corresponds to the current detection method defined by [3].

[16] A signal correction device (15A) for a current detection device (10A) comprising magnetism detection elements (11, 12) that detect magnetic flux density (B) and output a voltage signal ($V_{out}$) corresponding to the magnetic flux density (B), the signal correction device (15A) being configured to be connected to the current detection device (10A) to correct and output the output voltage signal ($V_1$), wherein the signal correction device (15A) corrects the output voltage signal ($V_1$) from the magnetism detection elements (11, 12) so as to be approximately linear with respect to magnetic flux density (B) and then outputs a corrected voltage signal ($V_L$) obtained by the correction, the correction being performed in accordance with a plurality of factors ($V_{off}$, $V_{sat}$, $B_b$, φ, α/A1 to A5) calculated by computational processing that is performed so that measured value data obtained as a result of providing the magnetic flux density (B) to the magnetism detection elements (11, 12) and indicating the relationship between the magnetic flux density (B) and an output voltage signal ($V_1$) is fitted to a formula including the plurality of factors ($V_{off}$, $V_{sat}$, $B_b$, φ, α/A1 to A5) and indicating the output voltage of the magnetism detection elements (11, 12).

This signal correction device (15A) for the current detection device (10A) corresponds to the signal correction method for the current detection device (10 A) defined by [11].

[17] The signal correction device (15A) for a current detection device (10A) defined by [16], wherein the formula including the plurality of factors ($V_{off}$, $V_{sat}$, $B_b$, φ, α/A1 to A5) for a measured magnetic field B and indicating output voltage signal $V_f$ of the magnetism detection elements is expressed by:

$$V_f = A1 + \frac{A4 \times B + A5}{\sqrt{B^2 + A2 \times B + A3}}$$

and each of the factors A1 to A5 is calculated so that the output voltage $V_f$ of the formula is fitted to the measured value data.

This signal correction device (15A) for the current detection device (10A) corresponds to current detection method defined by [3] and the signal correction method for the current detection device (10 A) defined by [13].

[18] The signal correction device (15A) for a current detection device (10A) defined by [17], wherein in the formula, the factor A1 is an output offset factor $V_{off}$, the factor A2 is 2·$B_b$·sin(α−φ), the factor A3 is a square of $B_b$, the factor A4 is $V_{sat}$·cos φ and the factor A5 is $B_b$·$V_{sat}$·sin α, and in the factors A2 to A5, $V_{sat}$ is a saturation output factor, $B_b$ is a bias magnetic field strength factor, φ is an angular offset factor of a direction of the measured electromagnetic field, and α is an angular offset factor of a direction of the bias magnetic field.

[19] The signal correction device (15A) for a current detection device (10A) defined by [17] or [18], wherein the corrected voltage signal ($V_L$) is output in accordance with a formula $V_L$=m×B($V_1$)+n (where the factor m is any given value except 0, and the factor n is any given value) and the plurality of factors ($V_{off}$, $V_{sat}$, $B_b$, φ, α/A1 to A5) calculated by the computational processing, the formula being obtained using the formula (1) under the conditions that the output voltage signal $V_f$ is replaced with an output voltage signal $V_1$ and a measured magnetic field B is a function of the output voltage signal $V_1$ (=B($V_1$)).

This signal correction device (15A) for the current detection device (10A) corresponds to current detection method defined by [4] and the signal correction method for the current detection device (10 A) defined by [14].

Although the embodiments of the invention have been described, the invention according to claims is not to be limited to the embodiments. Further, please note that all combinations of the features described in the embodiments are not necessary to solve the problem of the invention.

REFERENCE SIGNS LIST $V_{off}$: OUTPUT OFFSET FACTOR
$V_{sat}$: SATURATION OUTPUT FACTOR
$B_b$: BIAS MAGNETIC FIELD STRENGTH FACTOR
φ: ANGULAR OFFSET FACTOR OF DIRECTION OF MEASURED ELECTROMAGNETIC FIELD
α: ANGULAR OFFSET FACTOR OF DIRECTION OF BIAS MAGNETIC FIELD
A1 to A5: FACTOR
10, 10A: CURRENT DETECTION DEVICE
11, 12: MAGNETISM DETECTION ELEMENT
15: SIGNAL CORRECTION UNIT
15A: SIGNAL CORRECTION DEVICE
16, 16A: STORAGE UNIT
20: MAGNETIC FIELD GENERATOR
21: MAGNETIC SHIELDING BOX
22: SOLENOID COIL
30, 30A: CONTROL UNIT
31: MEASURED ELECTROMAGNETIC FIELD-GENERATING CONSTANT CURRENT SOURCE
32: CONSTANT-VOLTAGE SOURCE
34, 34A: VOLTAGE MEASUREMENT UNIT
35, 35A: FITTING FACTOR CALCULATION UNIT
36, 36A: FACTOR CONTROL UNIT

The invention claimed is:

1. A current detection method for a current detection device comprising magnetism detection elements that detect magnetic flux density and output a voltage signal corresponding to the magnetic flux density, the method comprising:
   acquiring measured value data that is obtained as a result of providing magnetic flux density in a detectable range of the magnetism detection elements and indicates the relationship between the magnetic flux density and an output voltage signal from the current detection device;
   performing computational processing so as to fit the acquired measured value data to a formula that includes a plurality of factors for a measured magnetic field B and indicates an output voltage signal $V_f$ of the magnetism detection elements, thereby calculating the plurality of factors; and
   correcting the output voltage signal from the magnetism detection elements in accordance with the calculated plurality of factors so as to be approximately linear with respect to the magnetic flux density, and then outputting a corrected voltage signal obtained by the correction,
   wherein the formula is expressed by:

$$V_f = A1 + \frac{A4 \times B + A5}{\sqrt{B^1 + A2 \times B + A3}}$$

and each of the factors A1 to A5 is calculated so that the output voltage signal $V_f$ obtained by the formula is fitted to an output voltage signal of the measured value data.

2. The current detection method according to claim 1, wherein in the formula, the factor A1 is an output offset factor $V_{off}$, the factor A2 is $2 \cdot B_b \cdot \sin(\alpha - \varphi)$, the factor A3 is a square of $B_b$, the factor A4 is $V_{sat} \cdot \cos \varphi$ and the factor A5 is $B_b \cdot V_{sat} \cdot \sin \alpha$, and in the factors A2 to A5, $V_{sat}$ is a saturation output factor, $B_b$ is a bias magnetic field strength factor, $\varphi$ is an angular offset factor of a direction of the measured electromagnetic field, and a is an angular offset factor of a direction of the bias magnetic field.

3. The current detection method according to claim 1, wherein the output voltage signal from the magnetism detection elements is corrected using a voltage correction unit, coupled to an output of the magnetism detection elements to receive the output voltage signal from the magnetism detection elements, and configured to correct the output voltage signal from the magnetism detection elements and output the corrected voltage signal, and wherein the corrected voltage signal $V_L$ is output in accordance with a formula for expressing the corrected voltage signal $V_L = m \times B(V_1) + n$ (where the factor m is any given value except 0, and the factor n is any given value) and the plurality of factors calculated by the computational processing, the formula being obtained using the formula under the conditions that the output voltage signal $V_f$ is replaced with an output voltage signal $V_1$ and the measured magnetic field B is a function of the output voltage signal $V_1$ (=$B(V_1)$).

4. A current detection device, comprising:
magnetism detection elements that detect magnetic flux density and output a voltage signal corresponding to the magnetic flux density; and
a signal correction means that corrects the output voltage signal from the magnetism detection elements so as to be approximately linear with respect to the magnetic flux density and then outputs a corrected voltage signal obtained by the correction, the correction being performed in accordance with a plurality of factors calculated by computational processing that is performed so that measured value data obtained as a result of providing the magnetic flux density to the magnetism detection elements and indicating the relationship between the magnetic flux density and an output voltage signal is fitted to a formula including the plurality of factors for a measured magnetic field B and indicating an output voltage signal $V_f$ of the magnetism detection elements,
wherein the formula is expressed by:

$$V_f = A1 + \frac{A4 \times B + A5}{\sqrt{B^2 + A2 \times B + A3}}$$

and each of the factors A1 to A5 is calculated so that the output voltage signal $V_f$ obtained by the formula is fitted to an output voltage signal of the measured value data.

5. The current detection device according to claim 4, wherein in the formula, the factor A1 is an output offset factor $V_{off}$, the factor A2 is $2 \cdot B_b \cdot \sin(\alpha - \varphi)$, the factor A3 is a square of $B_0$, the factor A4 is $V_{sat} \cdot \cos \varphi$ and the factor A5 is $B_b \cdot V_{sat} \cdot \sin \alpha$, and in the factors A2 to A5, $V_{sat}$ is a saturation output factor, $B_b$ is a bias magnetic field strength factor, $\varphi$ is an angular offset factor of a direction of the measured electromagnetic field, and $\alpha$ is an angular offset factor of a direction of the bias magnetic field.

6. The current detection device according to claim 4, wherein the corrected voltage signal $V_L$ is output in accordance with a formula for expressing the corrected voltage signal $V_L = m \times B(V_1) + n$ (where the factor m is any given value except 0, and the factor n is any given value) and the plurality of factors calculated by the computational processing, the formula being obtained using the formula under the conditions that the output voltage signal $V_f$ is replaced with an output voltage signal $V_1$ and the measured magnetic field B is a function of the output voltage signal $V_1$ (=$B(V_1)$).

7. A signal correction method for a current detection device comprising magnetism detection elements that detect magnetic flux density and output a voltage signal corresponding to the magnetic flux density and a signal correction means that comprises a storage unit for storing a plurality of factors and is configured to directly output an output voltage signal from the magnetism detection elements without change when the plurality of factors are not stored in the storage unit, and to correct an output voltage signal from the magnetism detection elements and then output a corrected output voltage signal obtained by the correction when the plurality of factors are stored in the storage unit, the output voltage signal being corrected in accordance with the plurality of factors so as to be approximately linear with respect to the magnetic flux density,
the method for the current detection device not storing the plurality of factors in the storage unit of the signal correction means, and the method comprising:
providing magnetic flux density in a detectable range of the magnetism detection elements;
acquiring measured value data that is obtained as a result of providing the magnetic flux density and indicates the relationship between the magnetic flux density and an output voltage signal from the current detection device;
performing computational processing so as to fit the acquired measured value data to a formula that includes the plurality of factors for a measured magnetic field B and indicates an output voltage signal $V_f$ of the magnetism detection elements, thereby calculating the plurality of factors; and
storing the calculated plurality of factors in the storage unit of the signal correction means,
wherein the formula is expressed by:

$$V_f = A1 + \frac{A4 \times B + A5}{\sqrt{B^2 + A2 \times B + A3}}$$

and each of the factors A1 to A5 is calculated so that the output voltage signal $V_f$ obtained by the formula is fitted to an output voltage signal of the measured value data.

8. The signal correction method for a current detection device according to claim 7, comprising:
after storing the plurality of factors in the storage unit of the signal correction means, measuring the corrected voltage signal obtained by providing the magnetic flux density in a detectable range of the magnetism detection elements to the current detection device;

determining whether or not the measured corrected voltage signal is approximately linear;
storing a measurement range of measured electromagnetic field in the storage unit when approximately linear;
performing the computational processing again using a limited range of measured electromagnetic field to calculate the plurality of factors when not approximately linear; and
storing the calculated plurality of factors and the limited range of measured electromagnetic field in the storage unit of the signal correction means.

9. A signal correction method for a current detection device comprising magnetism detection elements that detect magnetic flux density and output a voltage signal corresponding to the magnetic flux density, the method comprising:
acquiring measured value data that is obtained as a result of providing magnetic flux density in a detectable range of the magnetism detection elements and indicates the relationship between the magnetic flux density and an output voltage signal from the current detection device;
performing computational processing so as to fit the acquired measured value data to a formula that includes a plurality of factors for a measured magnetic field B and indicates an output voltage signal $V_f$ of the magnetism detection elements, thereby calculating the plurality of factors;
storing the calculated plurality of factors in a storage unit of a signal correction means that corrects the output voltage signal from the magnetism detection elements in accordance with the plurality of factors so as to be approximately linear with respect to magnetic flux density and then outputs a corrected voltage signal obtained by the correction; and
using the signal correction means with the plurality of factors stored in the storage unit as a signal correction device for the current detection device, wherein the formula is expressed by:

$$V_f = A1 + \frac{A4 \times B + A5}{\sqrt{B^2 + A2 \times B + A3}}$$

and each of the factors A1 to A5 is calculated so that the output voltage signal $V_f$ obtained by the formula is fitted to an output voltage signal of the measured value data.

10. The signal correction method for a current detection device according to claim 9, comprising:
after storing the plurality of factors in the storage unit of the signal correction means, measuring the corrected voltage signal obtained by providing the magnetic flux density in a detectable range of the magnetism detection elements to the current detection device;
determining whether or not the measured corrected voltage signal is approximately linear;
storing a measurement range of measured electromagnetic field in the storage unit when approximately linear;
performing the computational processing again using a limited range of measured electromagnetic field to calculate the plurality of factors when not approximately linear;
storing the calculated plurality of factors and the limited range of measured electromagnetic field in the storage unit of the signal correction means; and
using the signal correction means with the plurality of factors and the limited range of measured electromagnetic field stored in the storage unit as a signal correction device for the current detection device.

11. The signal correction method for a current detection device according to claim 10, wherein in the formula, the factor A1 is an output offset factor $V_{off}$, the factor A2 is $2 \cdot B_b \cdot \sin(\alpha-\varphi)$, the factor A3 is a square of $B_b$, the factor A4 is $V_{sat} \cdot \cos \varphi$ and the factor A5 is $B_b \cdot V_{sat} \cdot \sin \alpha$, and in the factors A2 to A5, $V_{sat}$ is a saturation output factor, $B_b$ is a bias magnetic field strength factor, $\varphi$ is an angular offset factor of a direction of the measured electromagnetic field, and $\alpha$ is an angular offset factor of a direction of the bias magnetic field.

12. The signal correction method for a current detection device according to claim 10, wherein the corrected voltage signal $V_L$ is output in accordance with a formula for expressing the corrected voltage signal $V_L = m \times B(V_1) + n$ (where the factor m is any given value except 0, and the factor n is any given value) and the plurality of factors calculated by the computational processing, the formula being obtained using the formula under the conditions that the output voltage signal $V_f$ is replaced with an output voltage signal $V_1$ and the measured magnetic field B is a function of the output voltage signal $V_1$ (=$B(V_1)$).

13. A current detection device comprising:
magnetism detection elements that detect magnetic flux density and output a voltage signal corresponding to the magnetic flux density; and
a signal correction device connected to the magnetism detection elements to receive the output voltage signal from the magnetism detection elements,
wherein the signal correction device corrects the output voltage signal from the magnetism detection elements so as to be approximately linear with respect to magnetic flux density and then outputs a corrected voltage signal obtained by the correction, the correction being performed in accordance with a plurality of factors calculated by computational processing that is performed so that measured value data obtained as a result of providing the magnetic flux density to the magnetism detection elements and indicating the relationship between the magnetic flux density and an output voltage signal is fitted to a formula including the plurality of factors for a measured magnetic field B and indicating an output voltage signal $V_f$ of the magnetism detection elements, wherein the formula is expressed by:

$$V_f = A1 + \frac{A4 \times B + A5}{\sqrt{B^2 + A2 \times B + A3}}$$

and each of the factors A1 to A5 is calculated so that the output voltage signal $V_f$ obtained by the formula is fitted to an output voltage signal of the measured value data.

14. The signal correction device for a current detection device according to claim 13, wherein in the formula, the factor A1 is an output offset factor $V_{off}$, the factor A2 is $2 \cdot B_b \cdot \sin(\alpha-\varphi)$, the factor A3 is a square of $B_b$, the factor A4 is $V_{sat} \cdot \cos \varphi$ and the factor A5 is $B_b \cdot V_{sat} \cdot \sin \alpha$, and in the factors A2 to A5, $V_{sat}$ is a saturation output factor, $B_b$ is a bias magnetic field strength factor, φ is an angular offset factor of a direction of the measured electromagnetic field, and a is an angular offset factor of a direction of the bias magnetic field.

15. The signal correction device for a current detection device according to claim 13, wherein the corrected voltage signal $V_L$ is output in accordance with a formula for expressing the corrected voltage signal $V_L = m \times B(V_1) + n$ (where the factor m is any given value except 0, and the factor n is any given value) and the plurality of factors calculated by the computational processing, the formula being obtained using the formula under the conditions that the output voltage signal $V_f$ is replaced with an output voltage signal $V_1$ and the measured magnetic field B is a function of the output voltage signal $V_1$ (=$B(V_1)$).

* * * * *